(12) United States Patent
Krishnamurthy et al.

(10) Patent No.: US 11,368,112 B2
(45) Date of Patent: Jun. 21, 2022

(54) CURRENT SENSING AND REGULATION FOR STEPPER MOTOR DRIVER

(71) Applicant: Texas Instruments Incorporated, Dallas, TX (US)

(72) Inventors: Ganapathi Shankar Krishnamurthy, Bangalore (IN); Venkata Naresh Kotikelapudi, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/703,132

(22) Filed: Dec. 4, 2019

(65) Prior Publication Data
US 2021/0099115 A1    Apr. 1, 2021

Related U.S. Application Data

(60) Provisional application No. 62/907,214, filed on Sep. 27, 2019.

(51) Int. Cl.
| H02P 8/12 | (2006.01) |
| G01R 19/165 | (2006.01) |
| H03K 5/24 | (2006.01) |
| H03M 1/00 | (2006.01) |
| H02P 7/03 | (2016.01) |

(Continued)

(52) U.S. Cl.
CPC .......... *H02P 8/12* (2013.01); *G01R 19/16519* (2013.01); *H02P 7/04* (2016.02); *H02P 8/22* (2013.01); *H03K 3/3565* (2013.01); *H03K 5/24* (2013.01); *H03K 17/687* (2013.01); *H03K 17/6871* (2013.01); *H03M 1/001* (2013.01);

(Continued)

(58) Field of Classification Search
CPC .................... H02P 8/12; H03K 17/687; H03K 2217/0063; H03K 2217/0072
See application file for complete search history.

(56) References Cited

U.S. PATENT DOCUMENTS

| 5,656,910 A | 8/1997 | Erckert |
| 7,911,255 B2 * | 3/2011 | Ochi ..................... H03F 3/2173 327/333 |

(Continued)

FOREIGN PATENT DOCUMENTS

| EP | 0083841 A1 | 7/1983 |
| EP | 0394941 A2 | 10/1990 |
| GB | 2188801 B | 12/1989 |

OTHER PUBLICATIONS

PCT Search Report dated Dec. 24, 2020.

*Primary Examiner* — Rina I Duda
(74) *Attorney, Agent, or Firm* — Valerie M. Davis; Charles A. Brill; Frank D. Cimino

(57) ABSTRACT

An integrated circuit includes an H-bridge circuit having a first output node for coupling to a high-side terminal of an inductor and a second output node for coupling to a low-side terminal of the inductor. A current source is coupled in series with a current sense FET between a digital upper supply voltage and the first output node, wherein during a fast decay mode, a gate of the current sense FET is coupled to be turned on. A current-sense comparator includes a first input coupled to a sensing node between the current source and the current sense FET, a second input coupled to the lower supply voltage and an output coupled to a driver control circuit.

14 Claims, 14 Drawing Sheets

(51) Int. Cl.
*H02P 8/22* (2006.01)
*H03K 17/687* (2006.01)
*H03K 3/3565* (2006.01)

(52) U.S. Cl.
CPC ............... *H03K 2217/0063* (2013.01); *H03K 2217/0072* (2013.01)

(56) References Cited

U.S. PATENT DOCUMENTS

| | | | | |
|---|---|---|---|---|
| 8,102,200 | B2* | 1/2012 | Araki | H02M 7/53871 |
| | | | | 327/538 |
| 8,222,846 | B2* | 7/2012 | Sugie | H02P 7/04 |
| | | | | 318/400.29 |
| 8,558,583 | B2* | 10/2013 | Sinow | H03K 17/6871 |
| | | | | 327/108 |
| 8,749,222 | B2* | 6/2014 | Williams | G01R 19/0092 |
| | | | | 324/76.11 |
| 2007/0194734 | A1* | 8/2007 | Weinmann | H02P 27/06 |
| | | | | 318/400.31 |
| 2014/0028234 | A1* | 1/2014 | Lee | H02P 7/04 |
| | | | | 318/490 |
| 2015/0311894 | A1* | 10/2015 | McIntosh | G01R 19/16571 |
| | | | | 307/130 |
| 2016/0087571 | A1* | 3/2016 | Berberich | H02P 25/22 |
| | | | | 318/496 |
| 2016/0099560 | A1* | 4/2016 | Yamada | H02H 5/044 |
| | | | | 361/103 |
| 2016/0255318 | A1* | 9/2016 | Chevallaz | G02B 26/0833 |
| | | | | 348/205 |
| 2017/0170819 | A1 | 6/2017 | Kanda | |

* cited by examiner

CURRENT SENSING AND REGULATION FOR STEPPER MOTOR DRIVER

PRIORITY UNDER 35 U.S.C § 119(e) & 37 C.F.R. § 1.78

This non-provisional application claims priority based upon the following prior United States provisional patent application(s): (i) "Improved Current Sensing and Regulation for Stepper Motor Driver," Application No. 62/907,214, filed Sep. 27, 2019, in the name(s) of Ganapathi Shankar Krishnamurthy and Venkata Naresh Kotikelapudi, which is hereby incorporated by reference in its entirety. This application is related to U.S. application Ser. No. 16/703,403, filed Dec. 4, 2019, now U.S. Publication No. 2021/0,099,116, published Apr. 1, 2021.

BACKGROUND

In stepper motors, motor position is controlled by regulating electrical current in two or more motor windings. Different stepper motor designs may have different numbers of windings, with the current waveform in each winding leading or lagging current waveforms associated with the other windings. While many aspects of current regulation are well understood, problematic areas of control still exist.

SUMMARY

Disclosed embodiments provide a current-sensing circuit that can sense the inductor current during fast decay mode. The circuit combines the negative current at the active low-side power FET during fast decay mode with a reference current and compares a voltage representing the combined currents to the lower supply voltage. In one embodiment, the current-sensing circuit for fast decay mode is separate from a current-sensing circuit for drive mode. In one embodiment, a single current-sensing circuit with a single comparator is operable during both drive mode and fast decay mode.

In one aspect, an embodiment of an integrated circuit is disclosed. The integrated circuit includes an H-bridge circuit comprising a first high-side power field effect transistor (FET) coupled in series with a first low-side power FET between a motor supply voltage and a lower supply voltage and a second high-side power FET coupled in series with a second low-side power FET between the motor supply voltage and the lower supply voltage, a first output node located between the first high-side power FET and the first low-side power FET for coupling to a high-side terminal of an inductor and a second output node located between the second high-side power FET and the second low-side power FET for coupling to a low-side terminal of the inductor; a current source coupled in series with a current sense FET between a digital upper supply voltage and the first output node, wherein during a fast decay mode, a gate of the current sense FET is coupled to be turned on; and a current-sense comparator comprising a first input coupled to a sensing node between the first current source and the current sense FET, a second input coupled to the lower supply voltage and an output coupled to a driver control circuit.

In another aspect, an embodiment of a system is disclosed. The system includes a stepper motor comprising a first inductor and a second inductor; a first H-bridge circuit comprising a first high-side power field effect transistor (FET) coupled in series with a first low-side power FET between a motor supply voltage and a lower supply voltage and a second high-side power FET coupled in series with a second low-side power FET between the motor supply voltage and the lower supply voltage, a first output node located between the first high-side power FET and the first low-side power FET being coupled to a high-side terminal of the first inductor and a second output node located between the second high-side power FET and the second low-side power FET is coupled to a low-side terminal of the first inductor; a current source coupled in series with a current sense FET between a motor supply voltage and the first output node, wherein during a fast decay mode, a gate of the current sense FET is coupled to be turned on; and a current-sense comparator comprising a first input coupled to a sensing node between the first current source and the first current sense FET, a second input coupled to the lower supply voltage and an output coupled to a first driver control circuit.

In yet another aspect, an embodiment of a method of operating a stepper motor is disclosed. The method includes attaching a first output node in an H-bridge circuit to a high-side terminal of an inductor, the first output node being between a first high-side power FET that is coupled to a motor supply voltage and a first low-side power FET that is coupled to a lower supply voltage; attaching a second output node in the H-bridge circuit to a low-side terminal of the inductor, the second output node being between a second high-side power FET that is coupled to the motor supply voltage and a second low-side power FET that is coupled to the lower supply voltage; and during a fast decay mode, coupling a current source to provide reference current that comprises a valley current limit, the current source being coupled to a current sensing node that is also coupled to a first input of a current sense comparator, coupling the current sensing node to the first output node and coupling a second input of the current sense comparator to the lower supply voltage.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Stepper Motor Operation

A stepper motor typically has two coils, i.e., inductors, which are arranged with a 90-degree angle between coils. For smooth operation, the current through each coil needs to have phase separation of 90-degrees in order to create a rotating magnetic field for the rotor to follow. Although current in the coils can be regulated using either a square wave or sine wave, current regulation with a sine wave profile has smoother operation and increased resolution in position. For purposes of this disclosure, current regulation in a single winding is referred to as an example of the current regulation in each winding.

Figure 7A:
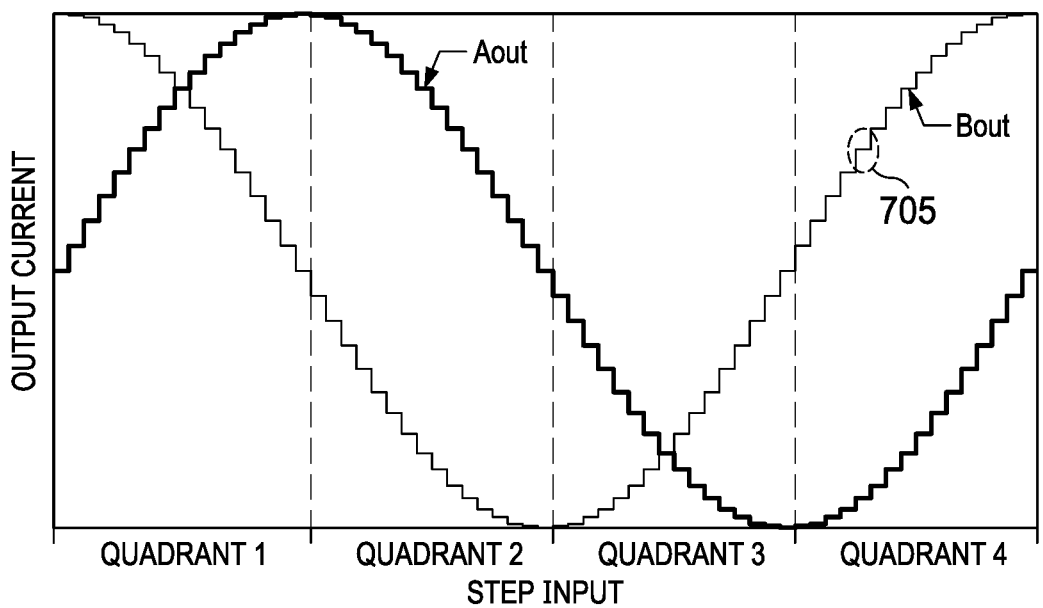
FIG. 7A demonstrates the currents through each of the two coils of a stepper motor and an example of the current control within each step.

In current implementations, the current waveform in a given motor winding is shaped by the output of a digital-to-analog converter (sine-DAC). A DAC output waveform, when viewed with sufficient magnification, is formed in a stair-stepped shape. For each digital input code ("DAC code"), an ideal DAC maintains a corresponding analog output voltage level. FIG. 7A depicts a graph 700A of the output currents in two coils of a stepper motor, with an "A" coil providing current Aout that follows a sine wave and a "B" coil providing current Bout that follows a cosine wave. In the example shown, each quadrant of the current signal is divided into sixteen (16) steps. Applications requiring greater position accuracy may utilize a much larger number of steps, e.g., 256, 1024 or 4096 micro-steps.

In the case of a stepper motor, each DAC input code results in a different mechanical rotational position of the stepper motor rotor. As such, any particular section of the waveform is stair-stepped upward for increasing currents and stair-stepped downward for decreasing currents. Once a DAC input code is applied and the winding current reaches a level corresponding to the top of the DAC step up or to the bottom of the DAC step down, that level of winding current is regulated to avoid any further mechanical rotation or vibration of the rotor until a different DAC input code is applied. Absent such regulation, factors such as supply voltage variations and changes in mechanical loads on the stepper motor may cause the winding current to vary during the duration of the desired step.

Figure 7B:
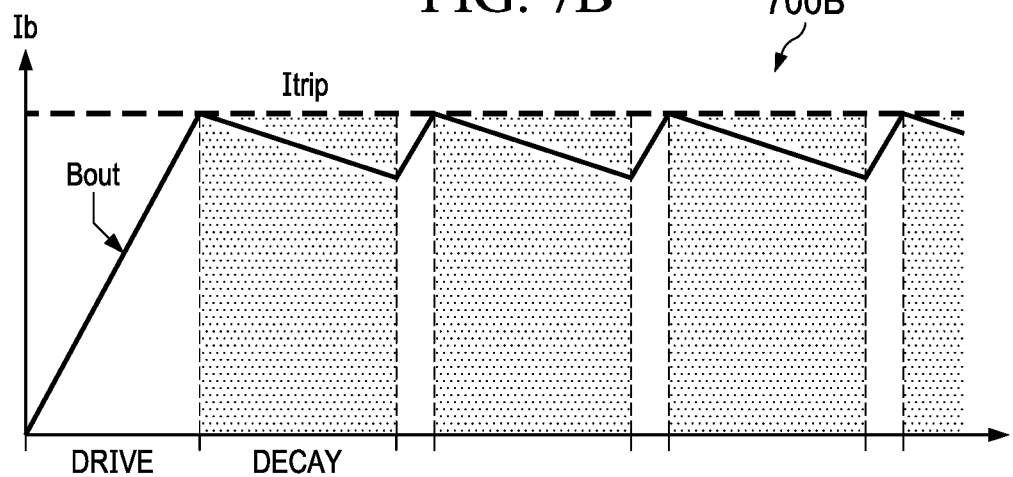
FIG. 7B demonstrates an example of the current control within each step of the current diagrams of FIG. 7A.

At each step in the waveform, such as step 705 circled in graph 700A, multiple pulse-width modulation cycles can occur, as illustrated in FIG. 7B by graph 700B. Graph 700B depicts a current, such as current Bout, as current regulation is provided by driver controls, which in this example use a peak current regulation scheme. As the coil is provided with a new rising step, current Bout rises in a drive mode until the current regulation circuit is able to detect that the current has reached a new peak current limit, identified as Itrip. The current then decays in either a fast decay mode or a slow decay mode for a period of time; followed by alternating drive and decay cycles to maintain the desired current.

Figure 8:
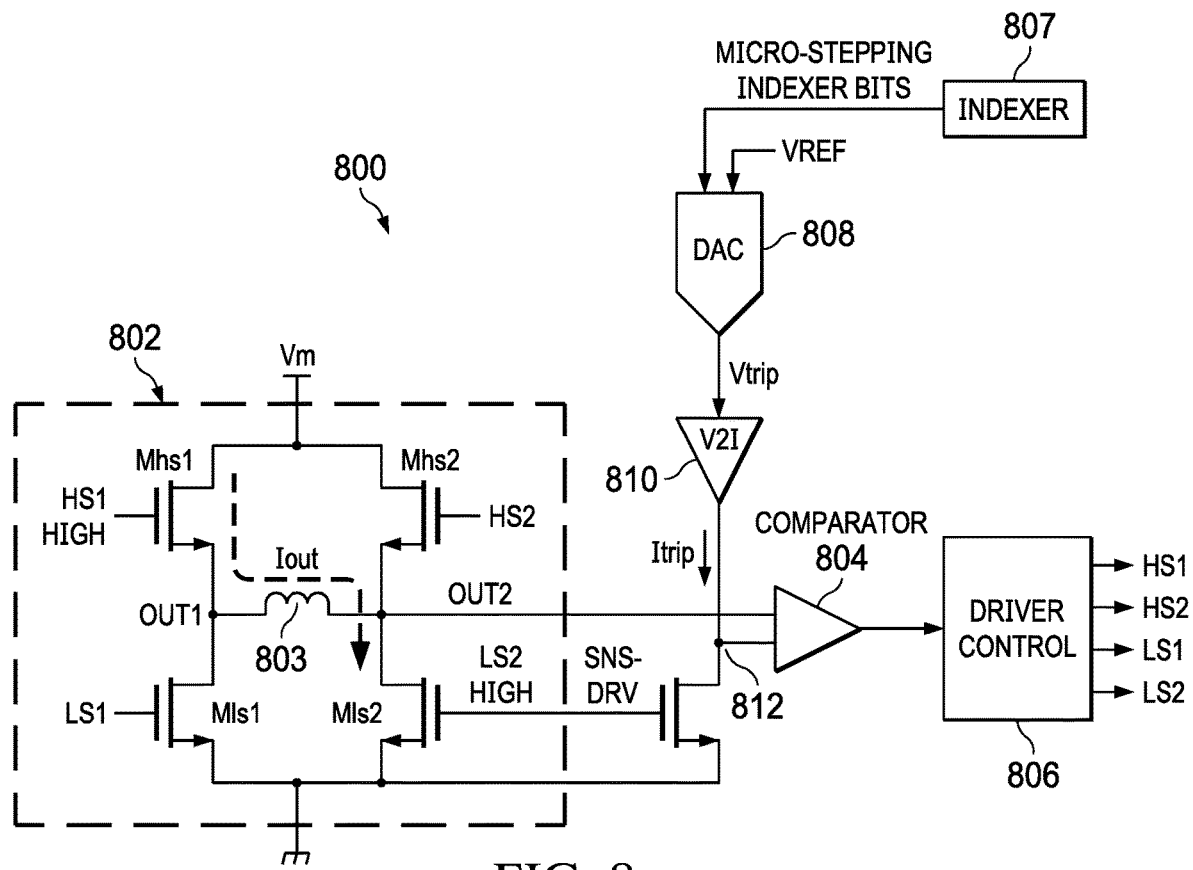
FIG. 8 depicts a baseline implementation of a current regulation circuit that can be used with a stepper motor.

FIG. 8 depicts a baseline implementation of a current regulation circuit 800 that can be used to drive one inductor of a stepper motor. Current regulation circuit 800 contains an H-bridge circuit 802 that contains a first high-side power FET Mhs1 coupled in series with a first low-side power FET Mls1 between a motor supply voltage Vm and a lower supply voltage, which can be a ground plane. A first output node OUT1 is located between the first high-side power FET Mhs1 and the first low-side power FET Mls1. H-bridge circuit 802 also contains a second high-side power FET Mhs2 coupled in series with a second low-side power FET Mls2 between the motor supply voltage Vm and the lower supply voltage; a second output node OUT2 is located between the second high-side power FET Mhs2 and the second low side power FET Mls2. During operation, an inductor 803 is coupled between first output node OUT1 and second output node OUT2 and the currents through inductor 803 are used to drive, e.g., a stepper motor. Respective gate control signals HS1, LS1, HS2, and LS2 are provided for the power FETs Mhs1, Mls1, Mhs2, and Mls2.

Current regulation circuit 800 further includes a digital-to-analog (sine-DAC) circuit 808, a voltage-to-current (V2I) operational amplifier 810, a drive-mode current sense FET SNS-DRV, a current-sense comparator 804 and driver control circuit 806. A micro-stepping indexer 807 has an output coupled to DAC circuit 808, which is also coupled to receive an analog reference voltage VREF. An output of DAC circuit 808 is coupled to an input to V2I operational amplifier 810. Drive-mode current sense FET SNS-DRV is coupled between the V2I operational amplifier 810 and the lower supply voltage and the gate of drive-mode current sense FET SNS-DRV is coupled to the gate of second low-side power FET Mls2. Sensing node 812 is located between V2I operational amplifier 810 and drive-mode current sense FET SNS-DRV. Current-sense comparator 804 has a first input coupled to the second output node, a second input coupled to the sensing node 812, and an output coupled to driver control circuit 806.

In the example shown in FIG. 8, current regulation circuit 800 is operating in drive mode, with first high-side power FET Mhs1 and second low-side power FET Mls2 turned on. Inductor current Iout flows from motor supply voltage Vm through first high-side power FET Mhs1, inductor 803 and second low-side power FET Mls2 to the lower supply voltage, increasing the inductor current Iout through inductor 803. During operation, micro-stepping indexer 807 provides micro-stepping indexer bits that are a sequence of DAC codes corresponding to a desired shape of a current waveform associated with one or more stepper motor position commands. DAC circuit 808 receives these micro-stepping indexer bits and analog reference voltage VREF. The DAC circuit 808 converts a current DAC code to an analog voltage set-point Vtrip, which is provided to V2I operational amplifier 810, which in turn supplies a peak current limit Itrip corresponding to the current micro-step. Since drive-mode sense FET SNS_DRV is also turned on during drive mode, sensing node 812 reflects the value of peak current limit Itrip. Current-sense comparator 804 will compare the current on second output node OUT2 to the peak current limit Itrip to determine when to turn off drive mode. The comparison is sent to driver control circuit 806, which provides the gate control signals HS1, HS2, LS1, and LS2 to control the power FETs in the H-bridge circuit. When current-sense comparator 804 detects that the inductor current Iout is greater than the peak current limit Itrip, the drive mode ends and a decay mode begins.

Figure 9:
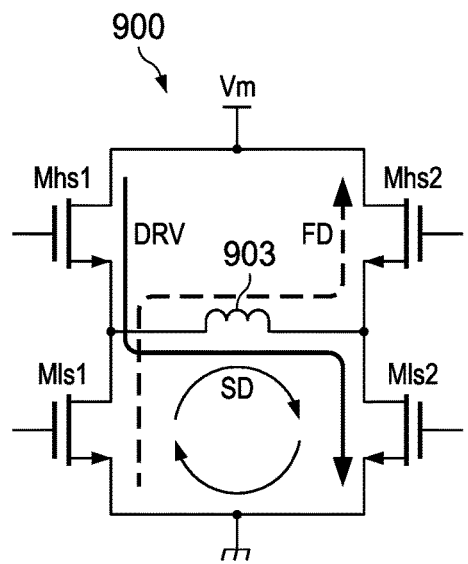
FIG. 9 depicts an H-bridge circuit and illustrates the current flow in each of the three phases.

FIG. 9 depicts an H-bridge circuit 900 and illustrates three conduction modes that can be used to drive a stepper motor: drive mode DRV, fast decay mode FD and slow decay mode SD. In drive mode, first high-side power FET Mhs1 and second low-side power FET Mls2 are turned on to drive a current from motor supply voltage Vm through first high-side power FET Mhs1, inductor 903, and second low-side power FET Mls2 to the lower supply voltage as shown by the solid arrow. The current ramps up in inductor 903 at a rate of Vm/L, where L is the inductance of inductor 903. After an initial blanking period at the beginning of the drive mode, which will be further explained below, the current through inductor 903 is compared to the peak current limit Itrip, e.g., using a comparator such as current-sense comparator 804 of current regulation circuit 800. As previously mentioned, when the inductor current Iout exceeds the value of the peak current limit Itrip, drive mode is turned off. The H-bridge circuit will then be controlled to go to either the fast decay mode or the slow decay mode.

In fast decay mode, second high-side FET Mhs2 and first low-side power FET Mls1 are turned on. Due to the inductance of inductor 903, current flows from the lower supply voltage through first low-side power FET Mls1, inductor 903 and second high-side power FET Mhs2 to motor supply voltage Vm, as shown by the dotted arrow, but decays with a slope of −Vm/L. In one embodiment, fast decay mode operates for a fixed time before entering drive mode again.

In slow decay mode, both first high-side power FET Mhs1 and second high-side power FET Mhs2 are turned off and both first low-side power FET Mls1 and second low-side power FET Mls2 are turned on, so that the current travels in a loop from the lower supply voltage through first low-side power FET Mls1, inductor 903, second low-side power FET Mls2 back to the lower supply voltage, as shown by the curving arrows. As suggested by the name, in slow decay mode the current through inductor 903 does not decay as quickly as in fast decay mode.

Adaptive Blanking Time

Figure 10:
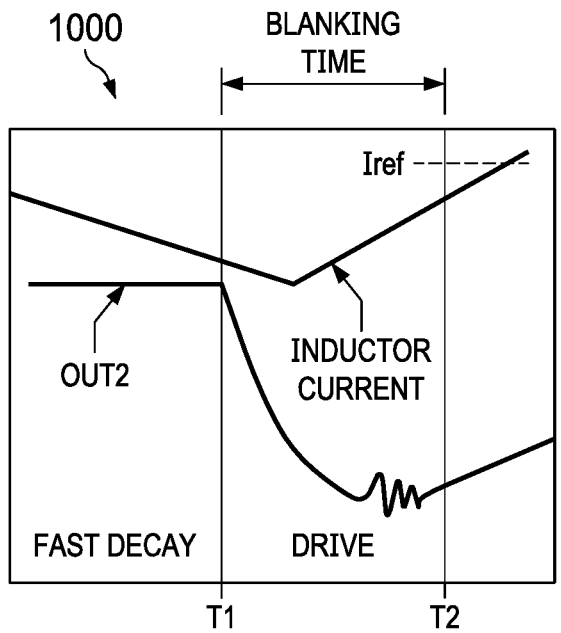
FIG. 10 depicts the inductor current and the voltage on the second output node OUT2 as the H-bridge is switched from fast decay mode to drive mode and illustrates the need for blanking as drive mode begins.

Although it is possible to start comparing the inductor current Iout to the peak current limit Itrip as soon as drive mode begins, an accurate comparison is not immediately available due to noise in the circuit. FIG. 10 illustrates this issue. Graph 1000 depicts both the inductor current Iout and the voltage on second output node OUT2 during the end of fast decay mode and the beginning of drive mode. During the end of fast decay mode, the inductor current Iout decreases at a steady rate while the voltage on output node is steady at about motor supply voltage Vm.

When fast decay mode is turned off at time T1, the voltage on second output node OUT2 drops quickly towards zero, while inductor current Iout continues moving downward briefly, then begins to rise again as drive mode takes effect. When the voltage on second output node OUT2 reaches zero, there can be ringing in the signal before the voltage starts to rise.

In order for the current sensing circuit shown in FIG. 8 to provide accurate measurements, second low-side power FET Mls2 needs to be operating in the linear region, with a voltage on second output node near zero. After drive mode starts, it is necessary to wait for second output node OUT2 to slew from motor supply voltage Vm to 0, e.g., at around time T2, before attempting to sense the current in inductor 803 through second low-side power FET Mls2. This means that blanking time should be always greater than the slew time of the driver.

Figure 11A:
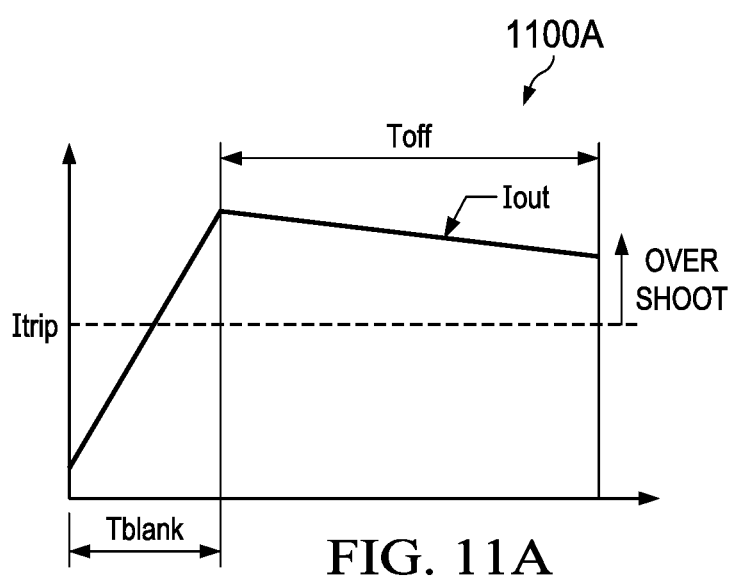
FIG. 11A depicts overshoot that can occur when the blanking time is too long.
Figure 11B:
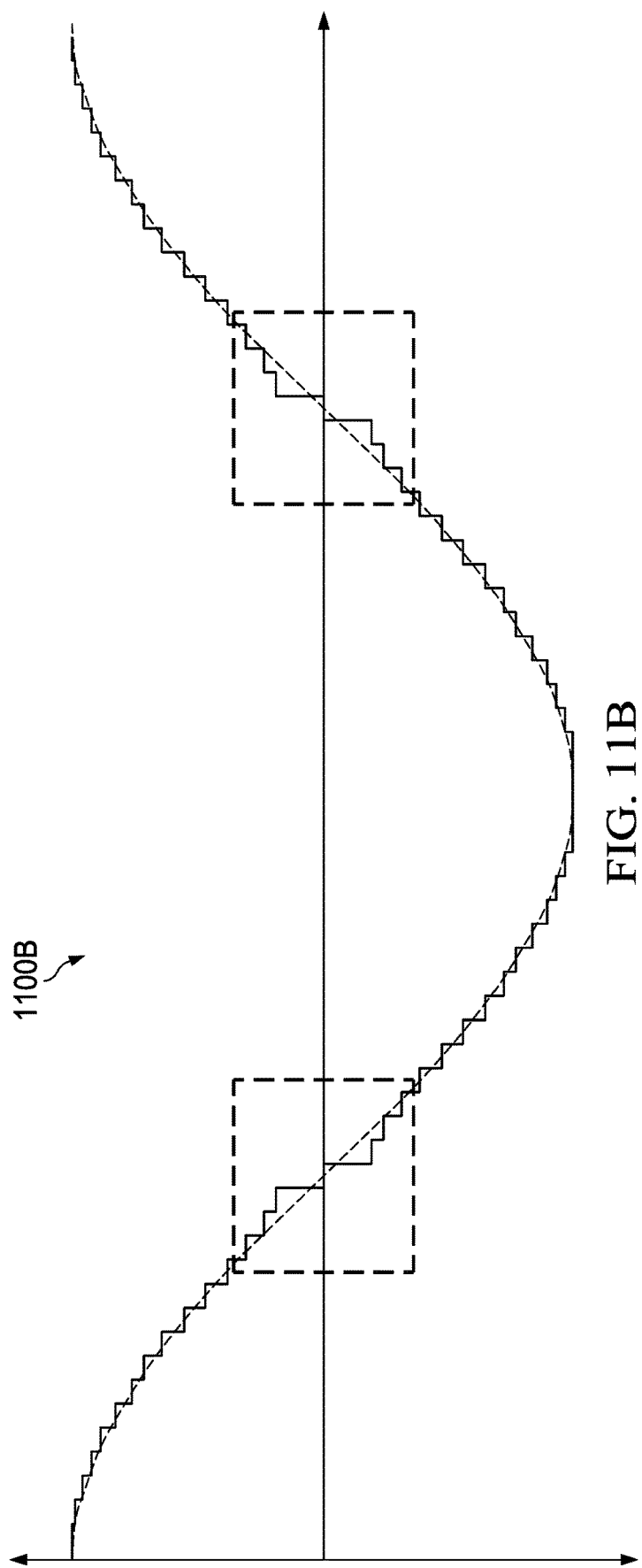
FIG. 11B depicts one potential result of overshoot.

Determining an appropriate amount of blanking time has proven difficult, especially when the current regulation system is expected to operate across a range of motor voltages and inductances. Providing higher blanking times, i.e., waiting for a longer time after drive mode begins before sensing can in some cases lead to inductor current Iout going beyond the value of the peak current limit Itrip. FIG. 11A depicts a graph 1100A contains an instance of this occurrence. By the time the blanking time Tblank is completed, the inductor current Iout has already exceeded peak current limit Itrip. In some embodiments, e.g., when the decay time Toff is a fixed value, too high a blanking time can lead to losing regulation in subsequent cycles and to a runaway current. This problem is more prominent during regulation of lower current levels and higher ratios of motor supply voltage to inductance, i.e., Vm/L. On the other hand, providing too low a blanking time can cause premature turn-off of drive mode and an unregulated inductor current Iout. This current distortion makes the motion or the stepper motor rougher, causes vibration, audible noise and angular error. An example of this uneven motion is shown in graph 1100B of FIG. 11B.

While the blanking time of a driver for a stepper motor is predominantly dependent on the slew-rate of the switching node, drivers for stepper motors that support automotive and industrial markets are expected to offer a wide range of programmable slew-rates, e.g., from 10 V/µs to 150 V/µs, to satisfy criteria like lesser electromagnetic interference (EMI), optimal power dissipation etc. additionally, the slew-rate can vary across process and temperature by around thirty percent (30%).

Many driver circuits for stepper motors use a fixed blanking time that is derived from the maximum value of simulation data and depending on the variation of the slew rates with process, temperature, device type and, to some extent, on motor supply voltage Vm. Typically, this blanking time is chosen for the worst case and is therefore higher than necessary in many other situations. Choosing the blanking time according to worst case scenarios can lead to current distortion problems and/or current runaway. Some driver circuits have blanking time programmability for lower and higher currents. At lower current levels much less noise is created, so a low blanking time is desirable to prevent current run away. However, blanking time programmability places the burden of selecting blanking times on the customer, based on the motor used.

Numerous problems can be caused by attempting to have a fixed blanking time, because the different slew-rate options require different blanking times. For a family of parts, the design time and digital logic modification are extensive to support different blanking times for multiple slew-rates. On some devices, the customer can change the slew-rate by adjusting the resistance provided on a pin. In such cases programing the blanking time is difficult. The blanking time limit can be selected to fit a worst case corner to prevent false trips, but this choice will generally result in higher than required blanking times and can lead to the current distortion problems and/or current runaway mentioned above.

Further, due to device modeling limitations, if the slew-rate in silicon doesn't match the simulated slew-rate, the result can be functional failures during current sensing. When higher blanking times are chosen, limits are imposed on the maximum step frequency and the maximum rotational speed for stepper motors. Accordingly, it is essential to optimize the blanking time.

Figure 1A:
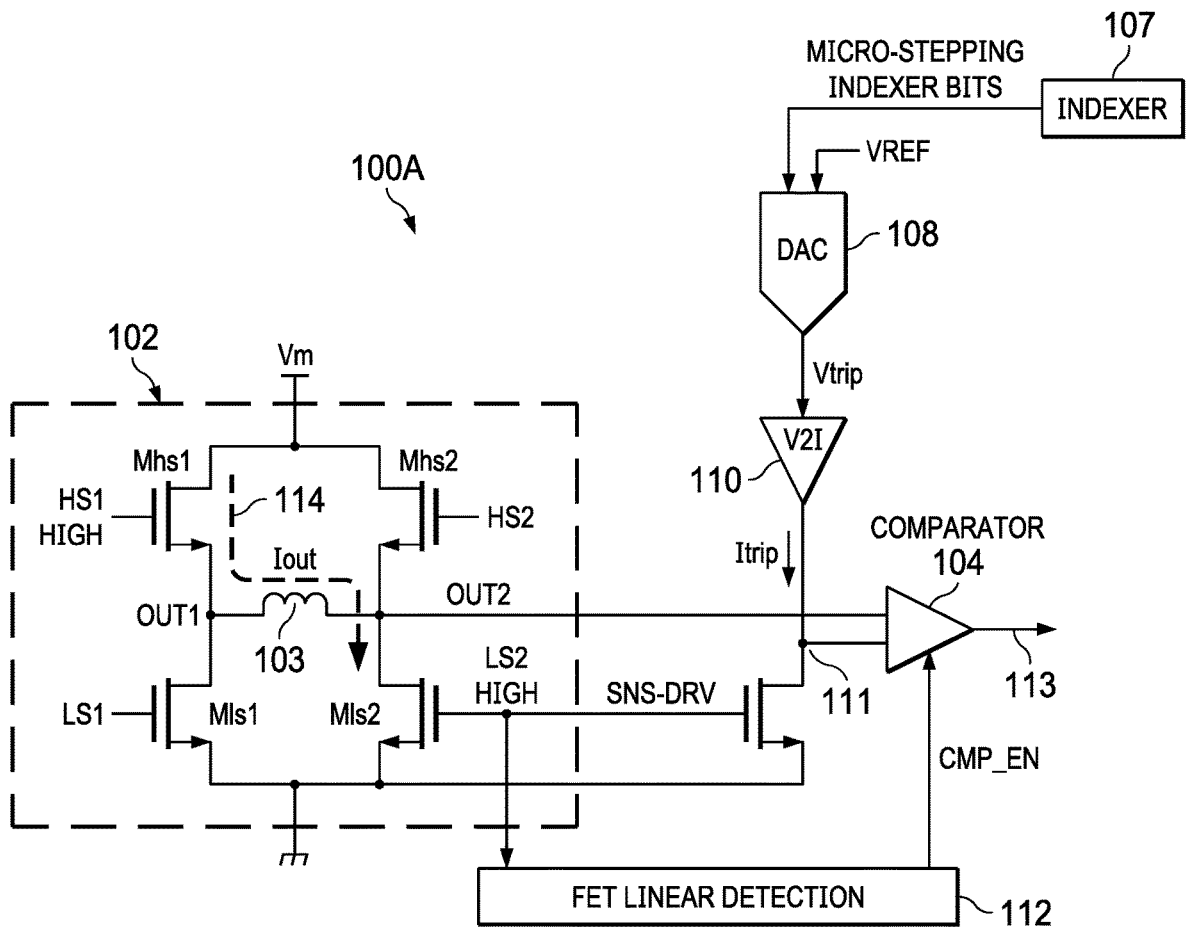
FIG. 1A illustrates an integrated circuit having an H-bridge circuit and a FET linear detection circuit that provides adaptive blanking according to an embodiment of the disclosure.

FIG. 1A depicts an H-bridge and current sense circuit 100A having a FET linear detection circuit 112 that provides adaptive blanking according to an embodiment of the disclosure. H-bridge and current sense circuit 100A contains an H-bridge circuit 102 that has an inductor 103 coupled between first output node OUT1 and second output node OUT2. H-bridge and current sense circuit 100A further includes micro-stepping indexer 107, DAC circuit 108, V2I operational amplifier 110, drive-mode current sense FET SNS-DRV and current-sense comparator 104. Although not specifically shown in current sense circuit 100A, except for the H-bridge, which receives motor voltage Vm, indexer 107, DAC 108, V2I operational amplifier 110, drive-mode current sense FET SNS-DRV, current-sense comparator 104 and FET linear detection circuit 112 are each powered by a digital upper supply voltage DVDD, which in one embodiment is 5 V. Micro-stepping stepping indexer 107 and an analog reference voltage VREF are coupled to provide inputs to DAC circuit 108. An output of DAC circuit 108 is coupled to an input of V2I operational amplifier 110. Drive-mode current sense FET SNS-DRV is coupled between the V2I operational amplifier 110 and the lower supply voltage and the gate of drive-mode current sense FET SNS-DRV is coupled to the gate of second low-side power FET Mls2. Sensing node 111 is located between V2I operational amplifier 110 and drive-mode current sense FET SNS-DRV. Current-sense comparator 104 has a first input coupled to the second output node OUT2, a second input coupled to the sensing node 111, and an output that is coupled to provide an output signal 113 to a driver control circuit (not specifically shown).

When H-bridge and current sense circuit 100A is operating in drive mode, first high-side power FET Mhs1 and second low-side power FET Mls2 are turned on and inductor current Iout flows as shown by arrow 114. Operation in drive mode continues as described previously, with micro-stepping indexer 107 providing indexer bits that are a sequence of DAC codes corresponding to a desired shape of a current waveform. DAC circuit 108 receives these micro-stepping indexer bits and analog reference voltage VREF, converts a current DAC code to the analog voltage set-point Vtrip, and provides analog voltage set-point Vtrip to V2I operational amplifier 110. During drive mode, drive-mode current sense FET SNS-DRV is turned on so that V2I operational amplifier 110 is coupled to the lower supply voltage to provide peak current limit Itrip corresponding to the current micro-step. Sensing node 111 provides the value of peak current limit Itrip to a second input node of current-sense comparator 804, which compares the current on second output node OUT2 to the peak current limit Itrip. When current-sense comparator 104 detects that the inductor current Iout is greater than the peak current limit Itrip, current-sense comparator 104 sends a high value to a driver control circuit so that drive mode ends and a decay mode begins.

The FET linear detection circuit operates with the active low-side power FET in the H-bridge circuit or with the second low-side power FET when both low-side power FETs are active. The operation of the FET linear detection circuit is described here during drive mode, but as will be further discussed below, an embodiment of the FET linear detection circuit can also operate during fast decay mode or slow decay mode. In H-bridge and current sense circuit 100A, FET linear detection circuit 112 is coupled to receive the second low-side gate control signal LS2 as an input and to provide a comparator enable signal CMP_EN to current-sense comparator 104. FET linear detection circuit 112 provides adaptive blanking by enabling current sensing at current-sense comparator 104 after the transition of second low-side power FET Mls2 from 'saturation' to the 'linear' region. In one embodiment, FET linear detection circuit 112 makes this determination by detecting when the gate of the second low-side power FET LS2 becomes greater than one threshold voltage below the digital upper supply voltage DVDD.

Figure 1B:
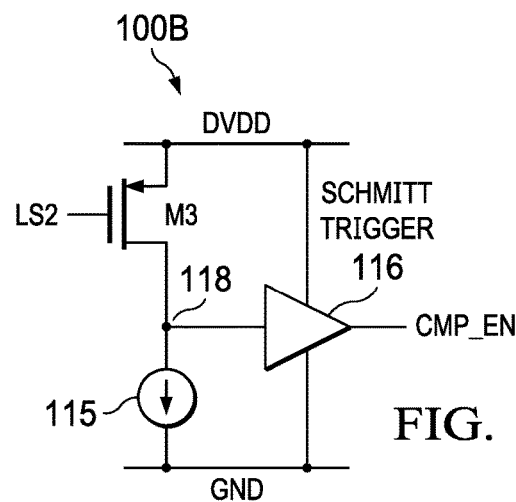
FIG. 1B depicts one example of a FET linear detection circuit according to an embodiment of the disclosure.
Figure 1C:
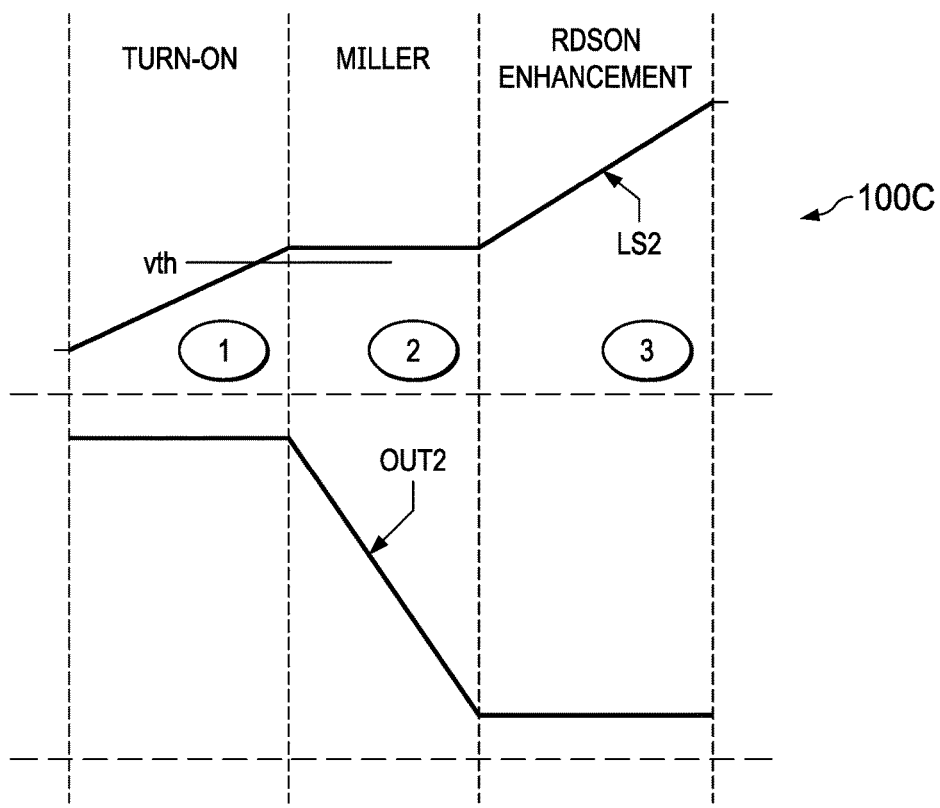
FIG. 1C depicts both the gate voltage on the active low-side power FET and the voltage on the second output node OUT2 as drive mode is initiated.

FIG. 1C depicts a graph 100C of the voltage on second low-side gate control signal LS2 and the voltage on second output node OUT2 as second low-side power FET Mls2 is being turned on; this brief period is divided into three separate time periods. In the first time period, the voltage on second low-side gate control signal LS2 begins to rise and will pass the threshold voltage Vth, so that second low-side power FET Mls2 begins to turn on. In the second time period, the second low-side gate control signal LS2 is in the miller plateau and does not rise; during the third time period the second low-side gate control signal LS2 begins to rise again.

In drive mode, the voltage on both first high-side gate control signal HS1 and second low-side gate control signal LS2 go high and the voltage on second output node OUT2 transitions from high to low. As seen in graph 100C, second low-side gate control signal LS2 remains in the miller plateau region during the transition of second output node OUT2. FET linear detection circuit 112 detects that the voltage has passed the end of the miller plateau, which indicates that second low-side power FET Mls2 is entering the linear region and hence the end of the need for blanking time.

FIG. 1B depicts one embodiment of a FET linear detection circuit 100B, which can use the knowledge shown in graph 100C to determine when to turn on comparator enable signal CMP_EN. In FET linear detection circuit 100B, a detection P-type field effect transistor (PFET) M3 is coupled in series with a current sink 115 between the digital upper supply voltage DVDD and the lower supply voltage. When used for adaptive blanking during drive mode, the gate of detection PFET M3 is coupled to the gate of second low-side power FET Mls2 to receive second low-side gate control signal LS2. A Schmitt trigger 116 is also coupled between the digital upper supply voltage DVDD and the lower supply voltage. The Schmitt trigger has an input that is coupled to a gate sense node 118 that lies between the detection PFET M3 and current sink 115 and has an output coupled to provide comparator enable signal CS-EN, which enables the current-sense comparator 104.

During the operation of H-bridge and current sense circuit 100A, when H-bridge circuit 102 is in fast decay mode, so that second low-side gate control signal LS2 is low, detection PFET M3 is turned on and provides a current to current sink 115 that keeps the voltage on gate sense node 118 high. The Schmitt trigger 116 produces a low signal on comparator enable signal CMP_EN so that current-sense comparator 104 is not enabled. When H-bridge circuit 102 begins drive mode, the second low-side gate control signal LS2 begins to rise and when it reaches a threshold voltage Vt below digital supply voltage DVDD, detection PFET M3 turns off. Because current sink 115 continues to sink current from gate sense node 118, the voltage on gate sense node 118 will go low and the Schmitt trigger 116 will provide a high signal on comparator enable signal CMP_EN, triggering the comparison of inductor current Iout to the peak current limit Itrip.

Figure 1D:
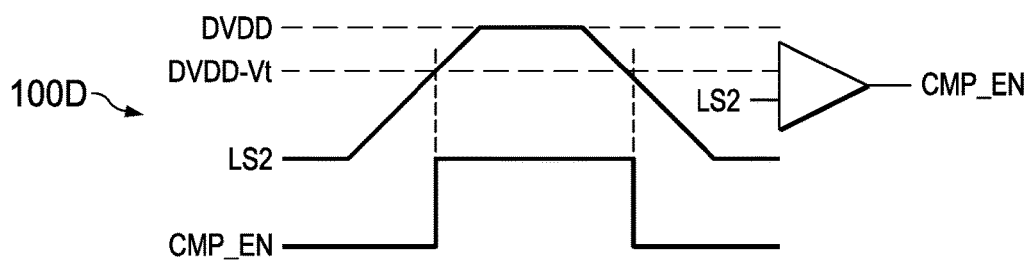
FIG. 1D depicts one example of a FET linear detection circuit according to an embodiment of the disclosure.

FIG. 1D depicts the second low-side control signal LS2 and the comparator enable signal CMP_EN during drive mode. Originally, both second low-side control signal LS2 and comparator enable signal CMP_EN are low, but as second low-side power FET Mls2 is turned on, second low-side control signal LS2 ramps upward. When second low-side control signal LS2 becomes greater than the value of DVDD-Vt, comparator enable signal CMP_EN goes high, ends blanking and starts current sensing. When the drive mode ends, second low-side control signal LS2 drops below DVDD-Vt, comparator enable signal CMP_EN turns off, and current-sense comparator 104 is disabled until the next time second low-side power FET Mls2 is turned on. Thus FET linear detection circuit 100B, as an example of FET linear detection circuit 112, provides an adaptive blanking period that is not dependent on the slew-rate. The blanking time can be optimal, avoiding either premature sensing or current runaway.

Figure 1E:
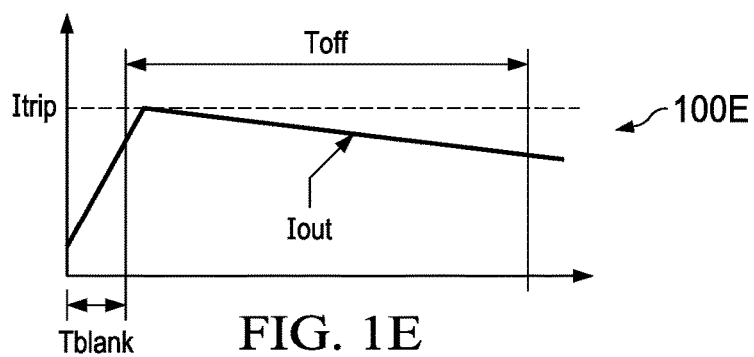
FIG. 1E depicts the timely termination of blanking time and lack of overshoot provided by the current regulation apparatus of FIG. 1A.

FIG. 1E depicts an example graph 100E of inductor current Iout when FET linear detection circuit 112 is used with the H-bridge circuit 102. Instead of having a blanking period that is too long, as depicted in graph 1100A, the inductor current Iout in graph 100E has a reduced blanking period Tblank. This shorter blanking period enables current-sense comparator 104 in time to detect inductor current Iout reaching peak current limit Itrip and to trigger the beginning of the fast decay mode. Issues such as current runaway can thus be avoided.

Figure 2A:
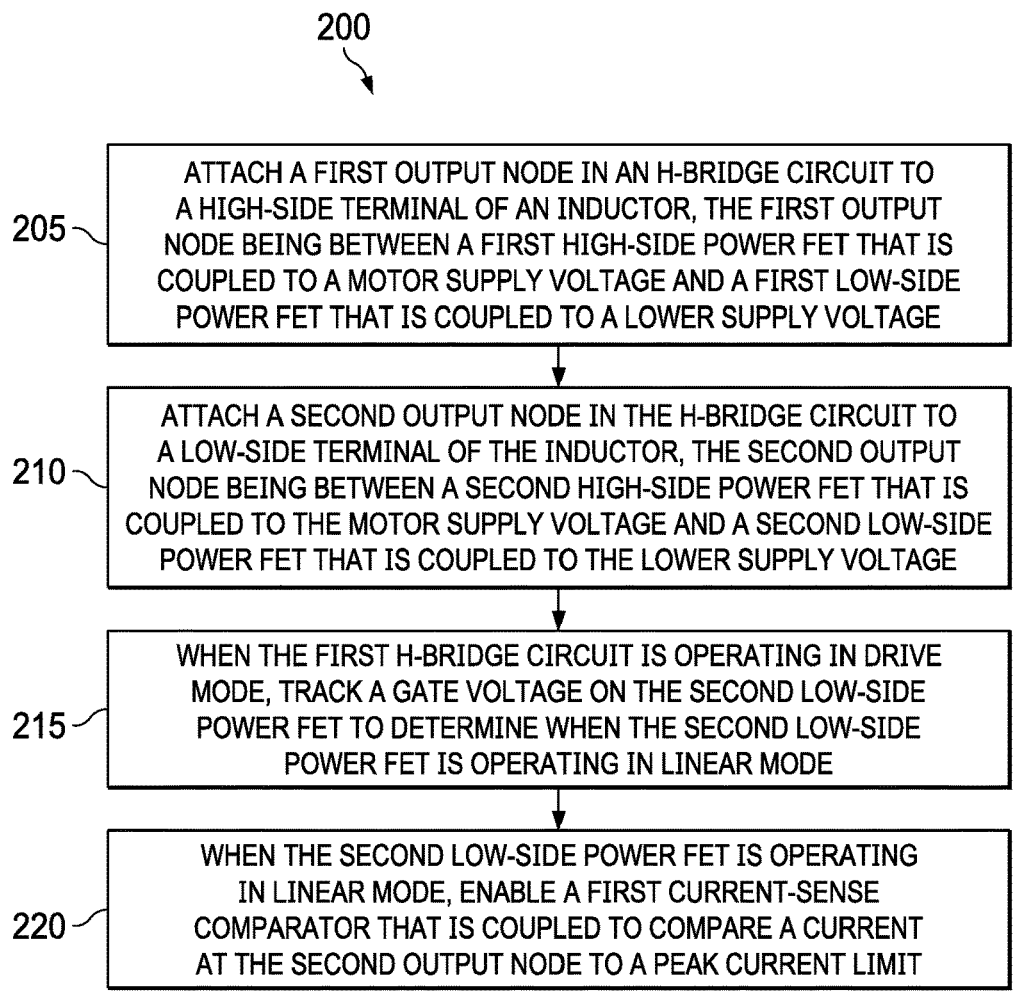
FIGS. 2A-2C depict a method of operating a stepper motor according to an embodiment of the disclosure.

FIG. 2A depicts a method 200 of operating a stepper motor according to an embodiment of the disclosure. The method begins with attaching 205 a first output node in an H-bridge circuit to a high-side terminal of an inductor and attaching 210 a second output node in the H-bridge circuit to a low-side terminal of the inductor. The first output node is between a first high-side power FET that is coupled to a motor supply voltage and a first low-side power FET that is coupled to a lower supply voltage. The second output node is between a second high-side power FET that is coupled to the motor supply voltage and a second low-side power FET that is coupled to the lower supply voltage. When the H-bridge circuit is operating in drive mode, a gate voltage on the second low-side power FET is tracked 215 to determine when the second low-side power FET is operating in the linear region. When the second low-side power FET is operating in the linear region, a first current-sense comparator is enabled 220. The first current-sense comparator is coupled to compare the inductor current Iout at the second output node OUT2 to a peak current limit Itrip.

Figure 2B:
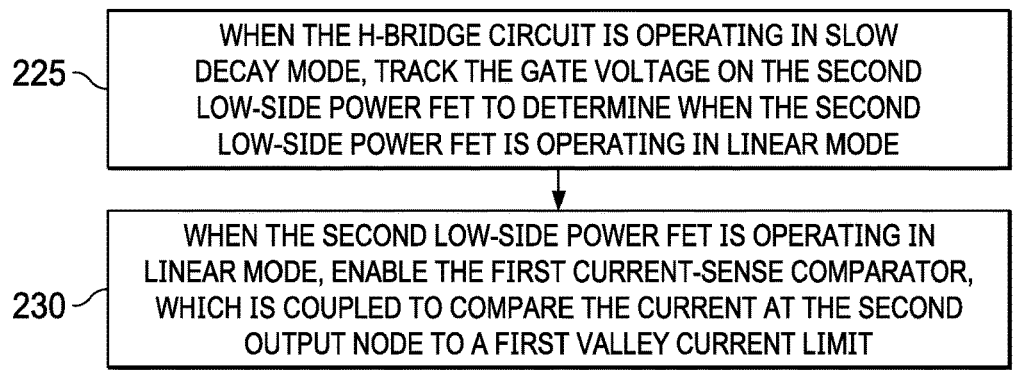

Although described above for operation in drive mode, adaptive blanking can also be utilized in both slow decay mode and fast decay mode. Operation in slow decay mode is shown in FIG. 2B. When the H-bridge circuit is operating in slow decay mode, the gate voltage on the second low-side power FET is tracked 225 to determine when the second low-side power FET is operating in linear mode. When the second low-side power FET is operating in linear mode, the first current-sense comparator, which is now coupled to compare the current at the second output node to a first valley current limit, is enabled 230.

Figure 2C:
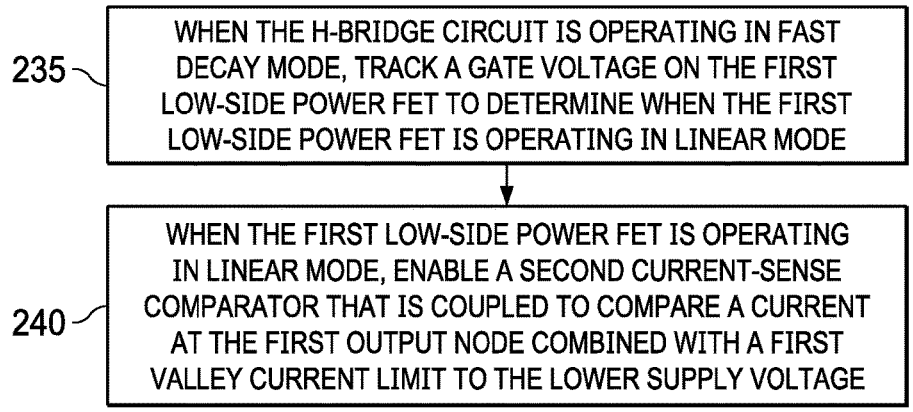

As shown in FIG. 2C, when the H-bridge circuit is operating in fast decay mode, the gate voltage on the first low-side power FET is tracked 235 to determine when the first low-side power FET is operating in linear mode. When first low-side power FET is operating in linear mode, a second current-sense comparator is enabled 240. The second current-sense comparator is coupled to compare the current at the first output node combined with the first valley current limit to the lower supply voltage. It will be understood that the method shown in FIGS. 2B and 2C is operable when the reference current used by the comparators is a hysteretic reference current that carries both the peak current limit Itrip and the valley current limit Ivalley.

The disclosed FET linear detection circuit and the associated method of operating a stepper motor may provide one or more of the following advantages:
Agnostic of the slew-rate of the driver;
Independent of the algorithm used for current regulation, e.g., fixed off time, fixed frequency, ripple control, etc.;
Fixed timers for each of multiple different slew rates are removed, allowing simplified circuits, area savings, a reduction of digital complexity and a reduction of design time for a family of products;
As pessimistic blanking times are not chosen, errors in average motor current and current runaway problems are avoided;

Automatically scales the minimum drive time with output current and may help alleviate zero-crossing distortion by limiting the drive time at low-current steps;

When the H-bridge circuit transitions from drive mode to slow decay mode, the second output node OUT2 already has a value of zero, so that there is no slew of second output node OUT2. In this case, the FET linear detection circuit 112 already provides a high value, which results in no blanking time. This response is ideal. Because the prior art doesn't track the gate voltage, prior art circuits will add blanking time irrespective of the transition.

Current Sensing in Fast Decay Mode

When the desired waveform calls for decreasing steps, the inductor current Iout needs to be dropped down the next lower level at each step. In a ripple control scheme, when decreasing steps occur, fast decay mode is initiated in order to reach the lower level as soon as possible. However, existing designs don't have current sensing during fast decay mode. Instead, after a fixed time in fast decay mode the driver enters into drive mode in order to sense the current.

Figure 12A:
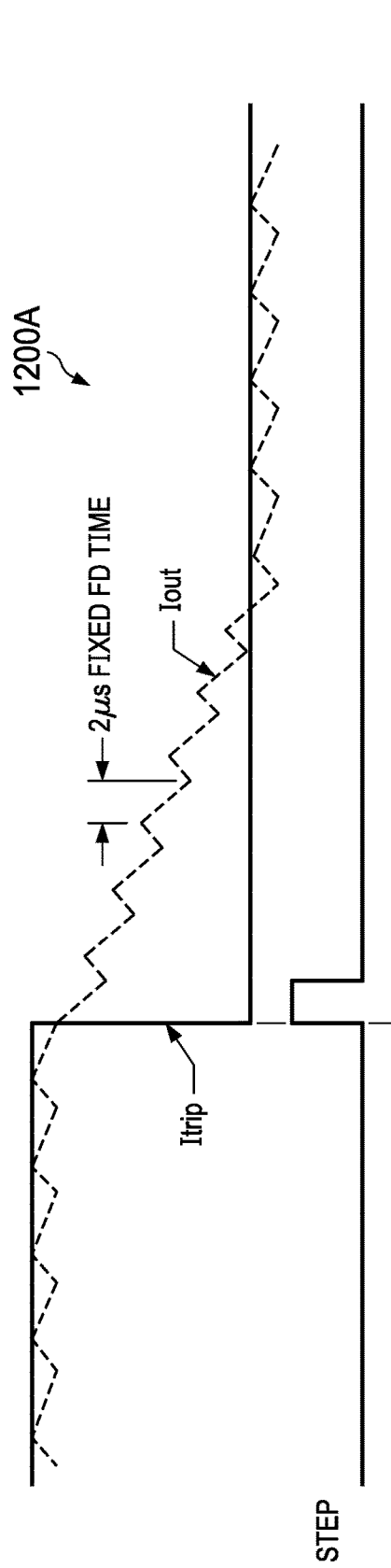
FIGS. 12A and 12B depict potential problems that can occur using a fixed decay time.

FIG. 12A depicts a graph 1200A that illustrates this problem in a motor having high inductance. Graph 1200A depicts the peak current limit Itrip, inductor current Iout, and a stepping indicator Step. Initially, inductor current Iout depicts the current as successive drive modes drive the current to the value of peak current limit Itrip, then allows the current to decay for a fixed amount of time. At time Ta, the stepping indicator Step provides a pulse to indicate that a new step is desired, which in the embodiment shown is a step downward. As the value of the peak current limit Itrip steps downward, inductor current Iout is set to decay in fast decay mode for a fixed time period of 2 μs, followed by putting the H-bridge circuit into drive mode for a period of time long enough to pass the blanking time and measure the inductor current Iout. Thus, rather than a desired quick drop to the next lower lever, the alternation of the fast decay cycle with drive mode increases the overall time taken to reach the next lower level. This creates torque ripple.

Figure 12B:
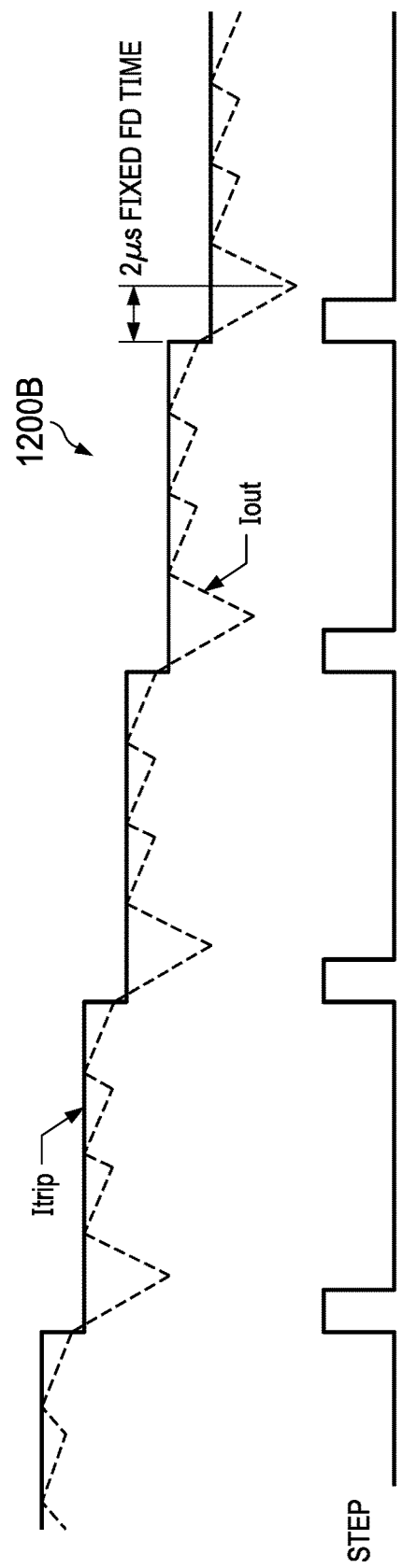

A different problem can occur for low inductance motors, as shown by graph 1200B in FIG. 12B. In this situation, a 2 μs fast decay period is again utilized. However, instead of taking a long period to decay to the next level, each time the stepping indicator Step provides a pulse and the value of peak current limit Itrip drops, inductor current Iout drops much further than desired during fast decay mode. This excessive drop results in huge current ripple that distorts the current waveform. As demonstrated by graphs 1200A and 1200B, a delay-based approach for fast decay time cannot be optimized across motor parameters.

The issues shown in graphs 1200A and 1200B result from the fact that the inductor current Iout cannot be sensed in fast decay mode. If the current through the motor can be reliably sensed in fast decay mode, then use of a time based approach can be eliminated and current can be regulated more precisely. The problem with sensing inductor current Iout during fast decay mode is that the voltage across inductor is negative, which poses a problem for current detection.

Figure 3A:
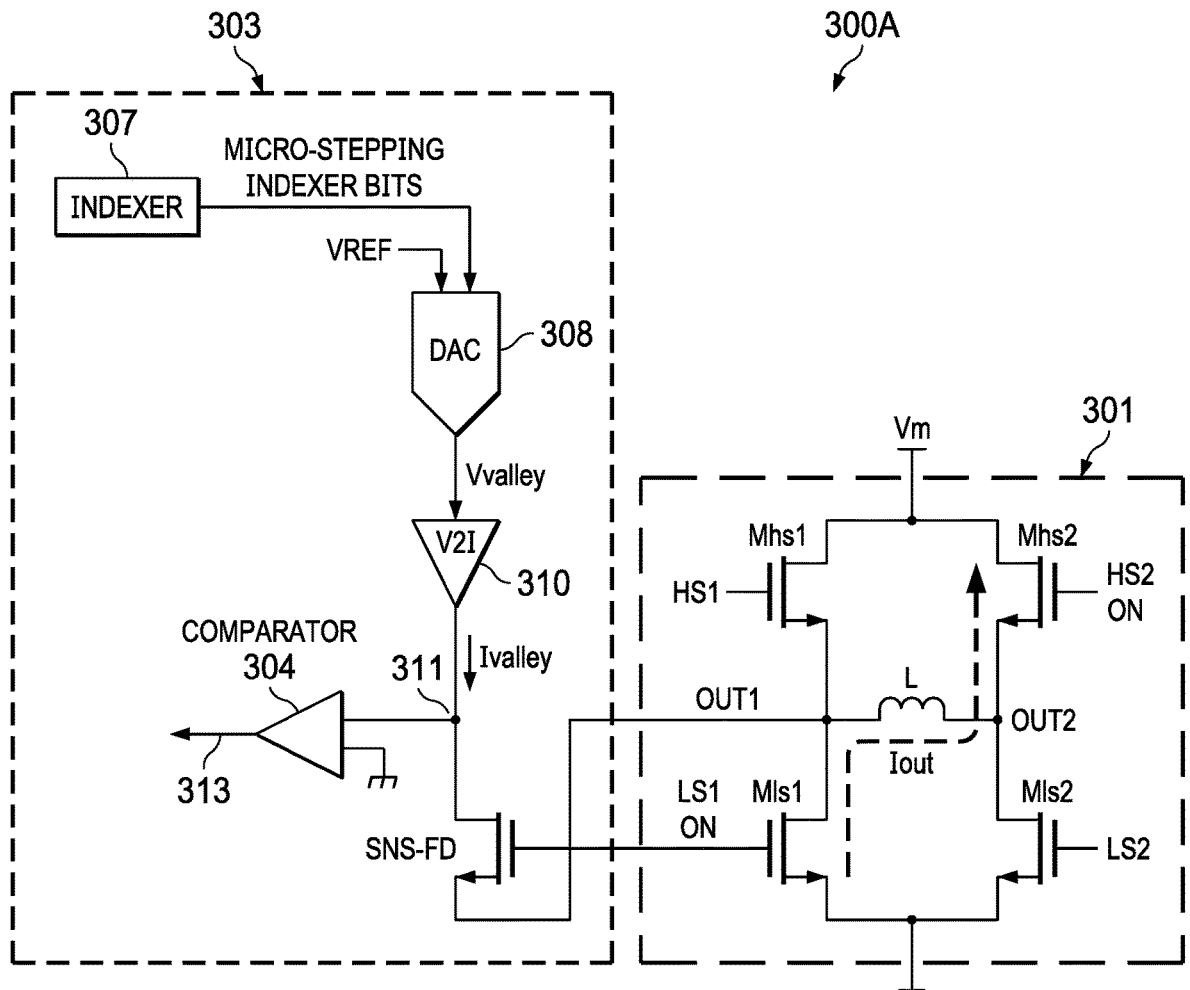
FIG. 3A illustrates an H-bridge and current sensing circuit having current sensing during fast decay mode according to an embodiment of the disclosure.

FIG. 3A depicts an H-bridge and current sense circuit 300A that includes an H-bridge circuit 301, which receives motor supply voltage Vm as an upper supply voltage, and a current sensing circuit 303, which receives digital supply voltage DVDD as an upper supply voltage. Current sensing circuit 303 is coupled to detect a valley current limit during fast decay mode and includes micro-stepping indexer 307, DAC circuit 308, V2I operational amplifier 310, fast-decay-mode current sense FET SNS-FD, and current sense comparator 304. Micro-stepping indexer 307 and the analog reference voltage VREF are coupled to provide inputs to DAC circuit 308. DAC circuit 308 is coupled to an input of V2I operational amplifier 310. Fast-decay-mode current sense FET SNS-FD is coupled between the V2I operational amplifier 110 and the first output node OUT1 and the gate of fast-decay-mode current sense FET SNS-FD is coupled to the gate of first low-side power FET Mls1. Sensing node 311 is located between V2I operational amplifier 310 and fast-decay-mode current sense FET SNS-FD. Current-sense comparator 304 has a first input coupled to the sensing node 311, a second input coupled to the lower supply voltage, and an output coupled to send an output signal 313 to a driver control circuit (not specifically shown).

Because the current at first output node OUT1 is negative during fast decay mode, the current at first output node OUT1 is added to a valley current limit Ivalley and provided to a first input of current-sense comparator 304. The combined current sensed on sensing node 311 is compared to the lower supply voltage, e.g., 0 V, to detect when the combined current crosses zero. In one embodiment, H-bridge and current sense circuit 300A can be combined with current regulation circuit 800 such that current-sense comparator 804 is a first current-sense comparator used to regulate current during the drive mode and current-sense comparator 104 is a second current-sense comparator used to regulate current during the fast decay mode. In the situation in which both a peak current limit Itrip and a valley current limit Ivalley are utilized, current-sense comparator 804 can also be utilized to sense the current during slow decay mode when both first low-side power FET Mls1 and second low-side power FET Mls2 are on.

Figure 3B:
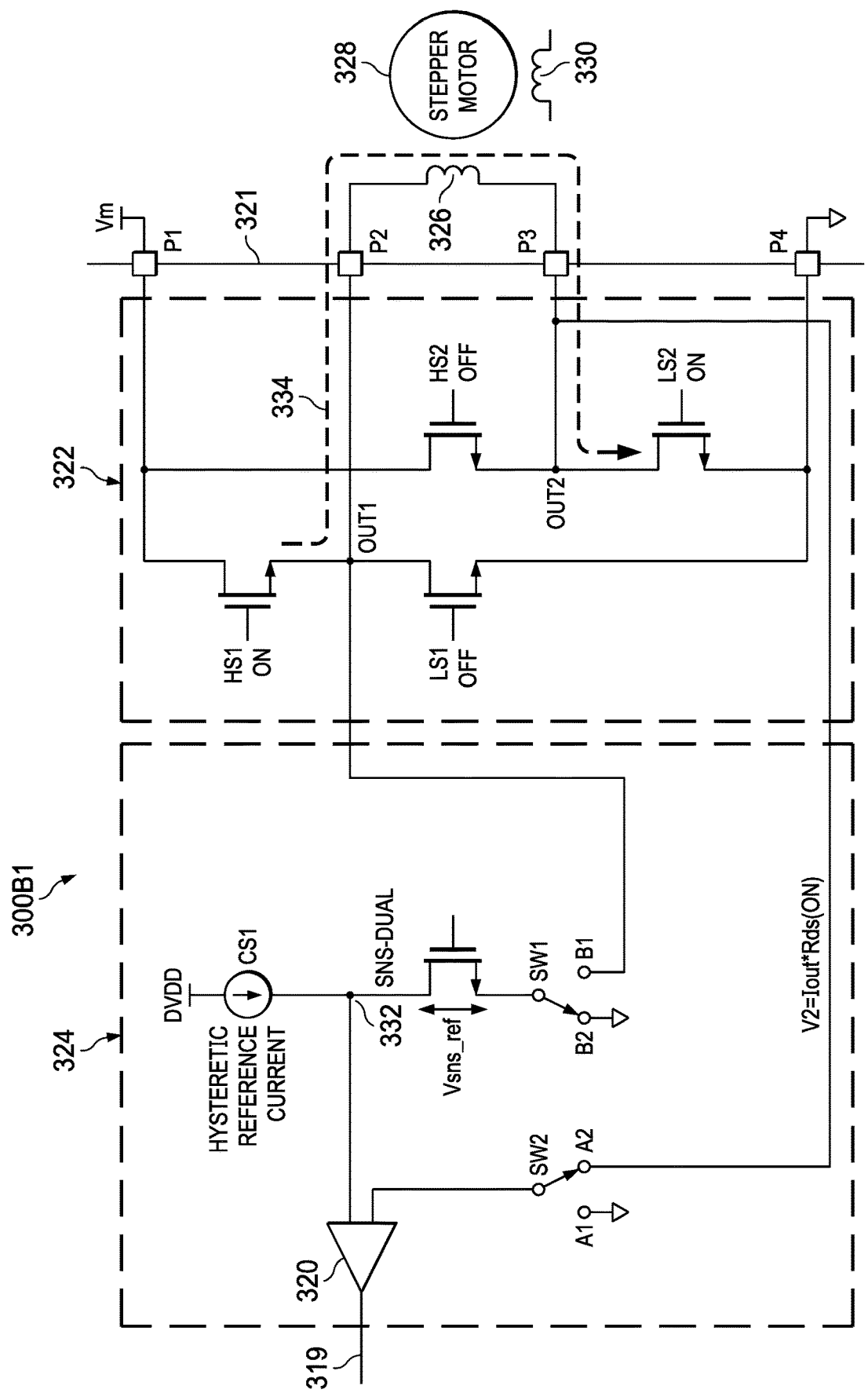
FIG. 3B illustrates an H-bridge and current sensing circuit having current sensing during both drive mode and fast decay mode and depicts drive mode operation according to an embodiment of the disclosure.
Figure 3C:
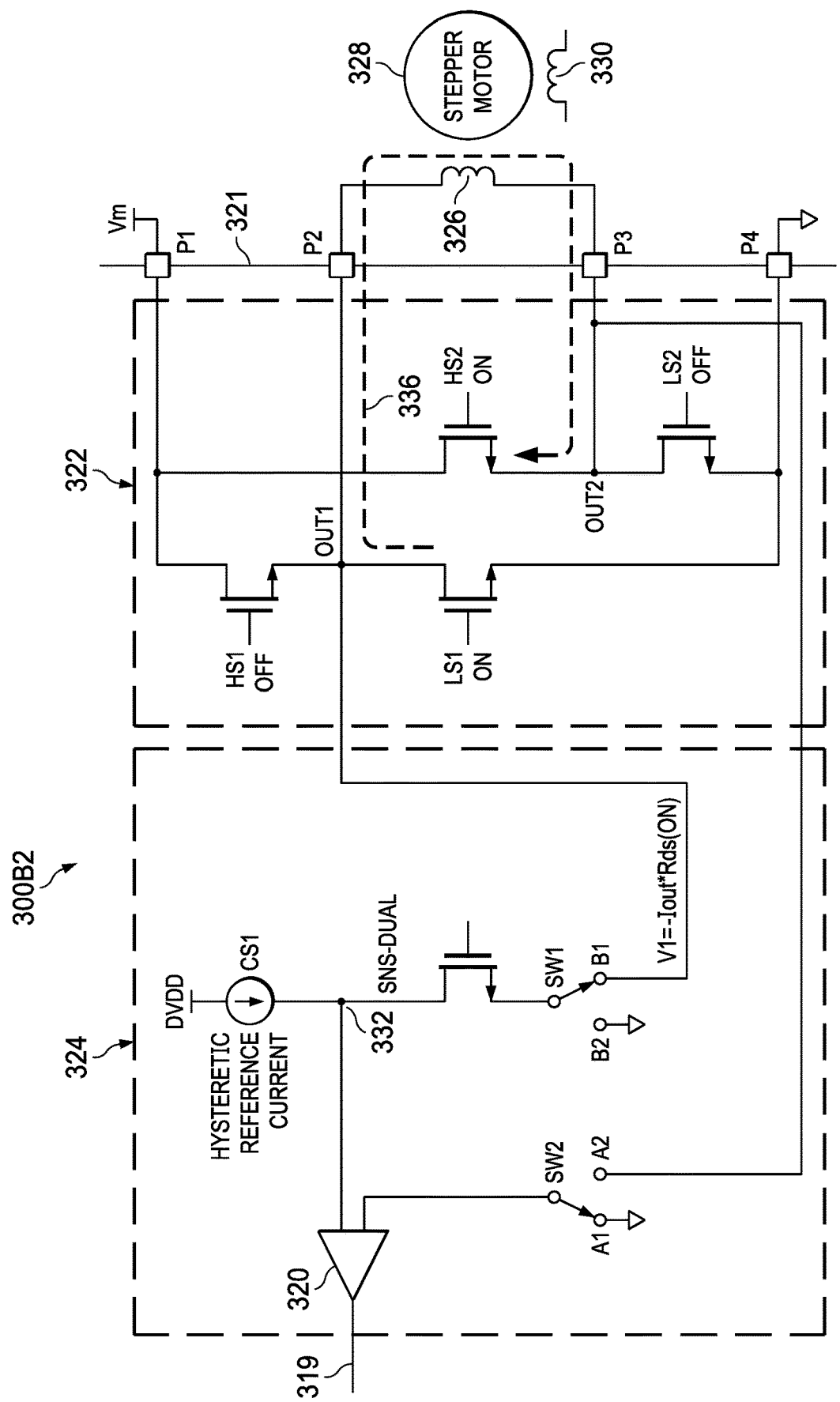
FIG. 3C illustrates an H-bridge and current sensing circuit having current sensing during both drive mode and fast decay mode and depicts fast decay mode operation according to an embodiment of the disclosure.

Another embodiment of an H-bridge and current sense circuit 300B is shown in both FIG. 3B and FIG. 3C. H-bridge and current sense circuit 300B1 is illustrated in FIG. 3B with settings for drive mode and H-bridge and current sense circuit 300B2 is illustrated in FIG. 3C with settings for fast decay mode. Using H-bridge and current sense circuit 300B, current sensing can be performed in both drive mode and in fast decay mode using a single current sense comparator 320. As depicted in FIGS. 3B and 3C, H-bridge and current sense circuit 300B is part of an integrated circuit (IC) chip 321 that includes H-bridge circuit 322 and current sensing circuit 324. Four pins on IC chip 321 are illustrated in H-bridge and current sense circuit 300B, i.e., pins P1-P4. A first pin P1 can be coupled to the motor supply voltage Vm to provide the motor supply voltage to the H-bridge. Second pin P2 is coupled to first output node OUT1 and can be coupled to a high-side terminal of a first inductor 326 of stepper motor 328. Third pin P3 is coupled to second output node OUT2 and can be coupled to a low-side terminal of the first inductor 326. A fourth pin P4 is coupled to provide the lower supply voltage and in one embodiment can be coupled to a ground plane. A second copy of H-bridge and current sense circuit 300B (not specifically shown) is typically present on IC chip 321 and can be coupled to the terminals of a second inductor 330 in stepper motor 328, but will receive control signals that provide a waveform that is offset from the waveform of H-bridge and current sense circuit 300B.

Current sensing circuit 324 includes a current source CS1 that is coupled in series with a sensing node SNS-DUAL between the digital upper supply voltage DVDD and a first switchable node SW1. First switchable node SW1 can be switchably coupled to either the first output node OUT1 or to the lower supply voltage. A sensing node 332 lies between current source CS1 and the first switchable node SW1 and is coupled to a first input of current sense comparator 320. A second input of current sense comparator 320 is coupled to a second switchable node SW2. Second switchable node SW2 can be switchably coupled to either the lower supply voltage or else to the second output node OUT2. As will be discussed further below, current source CS1 provides a hysteretic reference current. At each step in the desired waveform, current source CS1 is able to provide both a corresponding peak current limit and a corresponding valley current limit.

As shown in FIG. 3B, H-bridge and current sense circuit 300B1 is operating in drive mode, with the current moving through H-bridge circuit 322 and first inductor 326 as shown by arrow 334. Second output node OUT2 provides a second output voltage V2 that is equal to Iout*Rds(on) where Iout is the inductor current and Rds(on) is the source/drain on-resistance for the main FET, which in drive mode is second low-side power FET Mls2. Second output node OUT2 is coupled in drive mode to the second input of current sense comparator 320 through the second switchable node SW2 and the first switchable node SW1 is coupled to the lower supply voltage. During drive mode, current source CS1 provides the peak current limit Itrip. Current sense comparator 320 is thus comparing the current on second output node OUT2 to the peak current limit Itrip and when the current on the second output node OUT2 becomes greater than peak current limit Itrip, an output signal 319 is sent to a driver circuit (not specifically shown) to end the drive mode. Although not specifically shown, the settings in H-bridge and current sense circuit 300B1 can also be utilized to provide adaptive blanking during slow decay mode when both first low-side FET Mls1 and second low-side FET Mls2 are active. In this instance, the current source CS1 provides a current representative of the valley current limit.

As shown in FIG. 3C, H-bridge and current sense circuit 300B2 is operating in fast decay mode, with the current moving through H-bridge circuit 322 and first inductor 326 as shown by arrow 336. First output node OUT1 provides a first output voltage V1 that is equal to −Iout*Rds(on) where again Iout is the inductor current and Rds(on) is the source/drain on-resistance for the main FET, which in fast decay mode is first low-side power FET Mls1. In fast decay mode, first output node OUT1 is coupled to sensing node 332 and to the first input of current sense comparator 320 through the first switchable node SW1 and the second switchable node SW2 is coupled to the lower supply voltage. During fast decay mode, current source CS1 provides the valley current limit Ivalley, so that current sense comparator 320 is comparing the current on first output node OUT1 combined with valley current limit Ivalley to zero and when the combined current crosses zero, an output signal 319 is sent to a driver circuit (not specifically shown) to end the fast decay mode.

Although not specifically shown in these figures, each of H-bridge and current sense circuits 300A, 300B can include a FET linear detection circuit to determine when to enable a respective current sense comparator 304, 320. In FIG. 3A, a FET linear detection circuit can be coupled to receive the gate voltage on first low-side power FET Mls1 and coupled to comparator 304 to provide a comparator enable signal. In FIG. 3B, a FET linear detection circuit can be switchably coupled to receive the gate voltage on first low-side power FET Mls1 during fast decay mode and to receive the gate voltage on second low-side power FET Mls2 during drive mode and during slow decay mode.

Figure 4A:
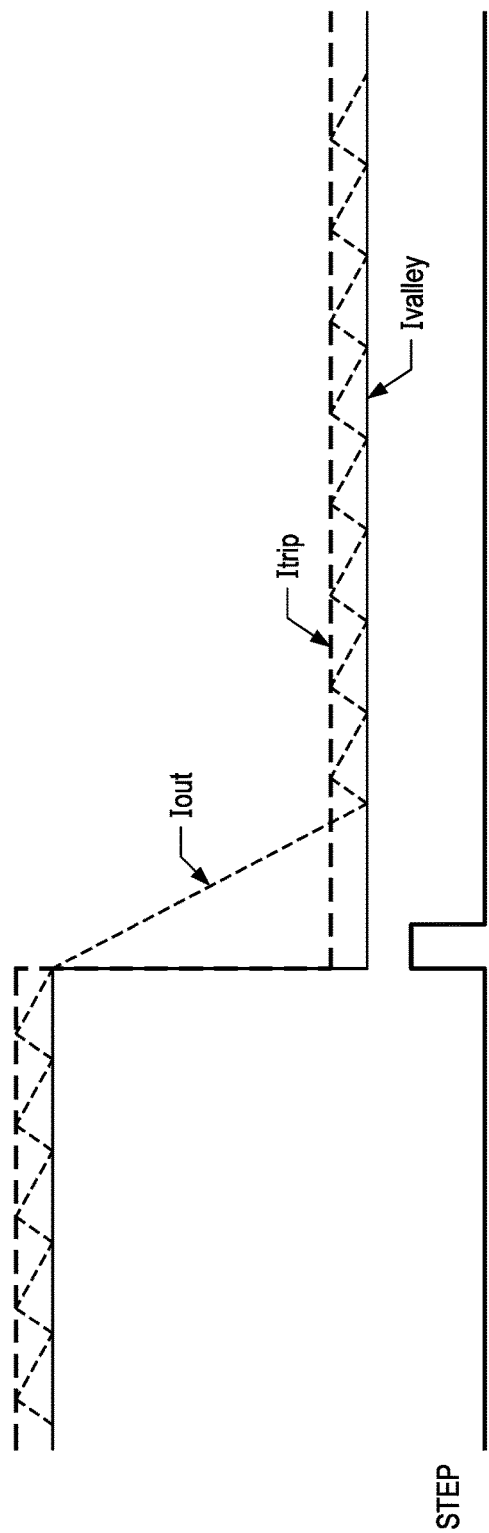
FIGS. 4A and 4B depict the improvement to the inductor current in several example situations using the disclosed current sensing circuit according to an embodiment of the disclosure.
Figure 4B:
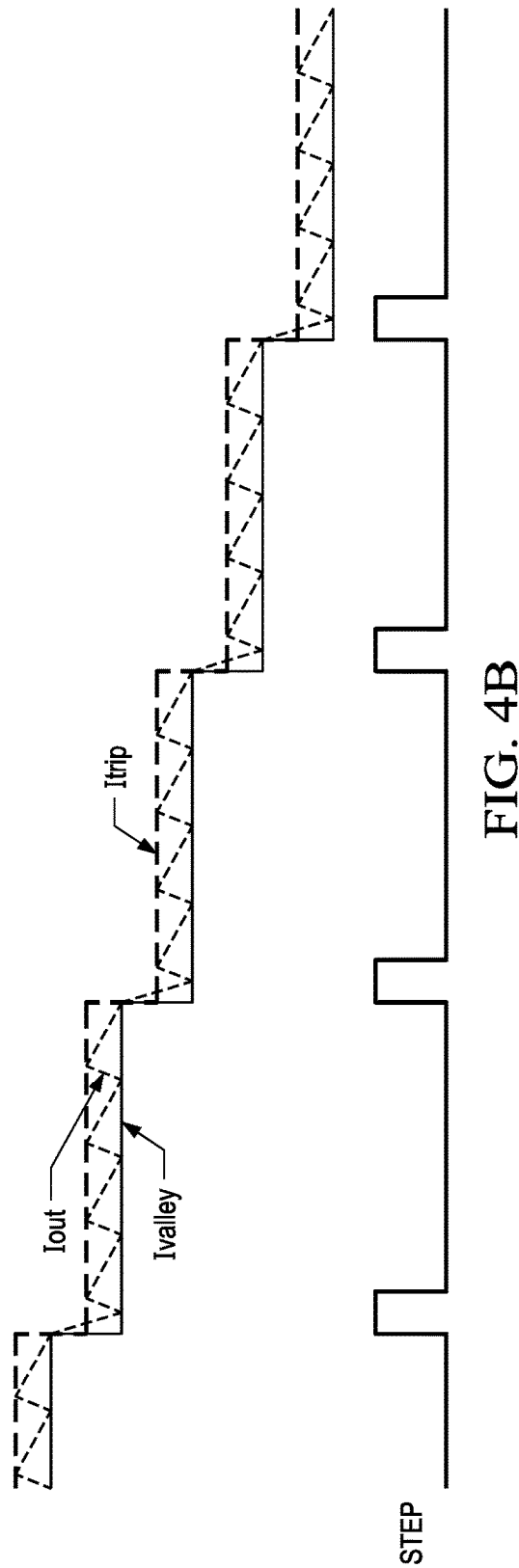

FIGS. 12A and 12B have depicted issues that can arise when it is not possible to sense the current in fast decay mode. FIGS. 4A and 4B depict the inductor current Iout when using current sensing in fast decay mode; FIG. 4A depicts a situation similar to FIG. 12A and FIG. 4B depicts a situation similar to FIG. 12B. In both FIGS. 4A and 12A, the motor has a high inductance. When 2 μs was used for each fast decay period and was followed by a switch to drive mode, a slow drop to the new settings results. In FIG. 4A, because current sensing in fast decay mode was used, the inductor current Iout is able to continue in fast decay mode until the valley current limit Ivalley is reached, resulting in a much faster drop to the new levels.

In both FIGS. 4B and 12B, the motor has a low inductance. When no current sensing is available during the fixed fast decay period, inductor current Iout may fall far below the peak current limit Itrip before the motor switches to drive mode to determine the value of the inductor current Iout. In FIG. 4B, by using the valley current limit and current sensing in fast decay mode, the inductor current Iout does not drop below desired values and can provide smoother operation.

Figure 5A:
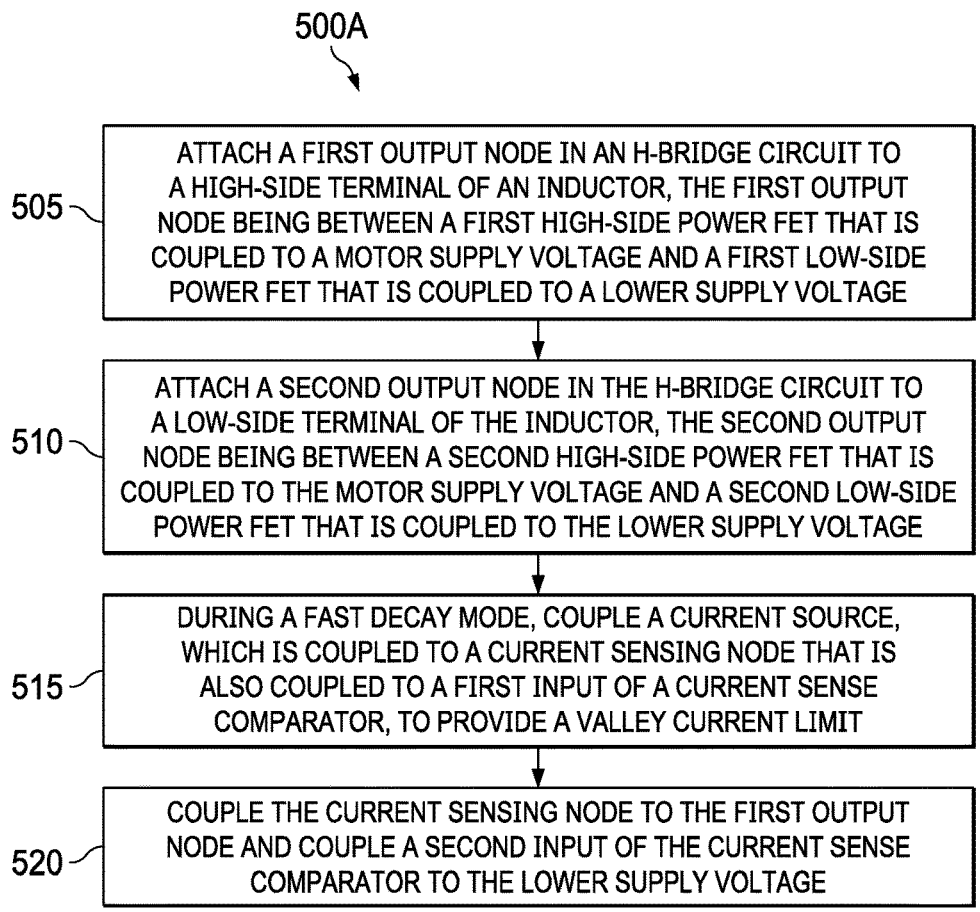
FIG. 5A depicts a method of operating a stepper motor according to an embodiment of the disclosure.

FIG. 5A depicts a method 500A of operating a stepper motor according to an embodiment of the disclosure. Method 500A starts with attaching 505 a first output node in an H-bridge circuit to a high-side terminal of an inductor and attaching 510 a second output node in the H-bridge circuit to a low-side terminal of the inductor. The first output node lies between a first high-side power FET that is coupled to a motor supply voltage and a first low-side power FET that is coupled to a lower supply voltage and the second output node is between a second high-side power FET that is coupled to the motor supply voltage and a second low-side power FET that is coupled to the lower supply voltage.

Method 500A further includes, during a fast decay mode, coupling 515 a current source, which is coupled to a current sensing node that is also coupled to a first input of a current sense comparator, to provide a valley current limit. The method further includes coupling 520 the current sensing node to the first output node and coupling the second input of the current sense comparator to the lower supply voltage.

Figure 5B:
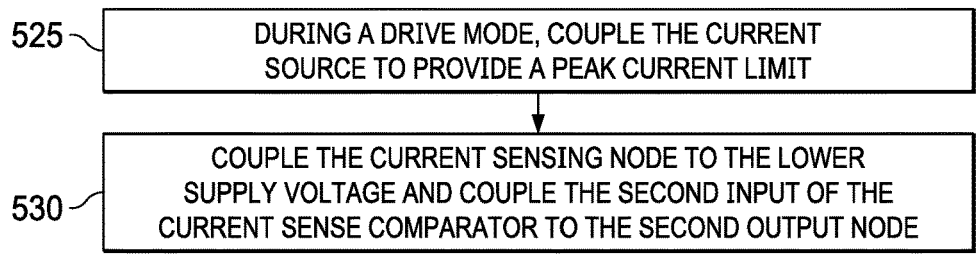
FIGS. 5B and 5C depict additional elements in the method of operating a stepper motor according to an embodiment of the disclosure.
Figure 5C:
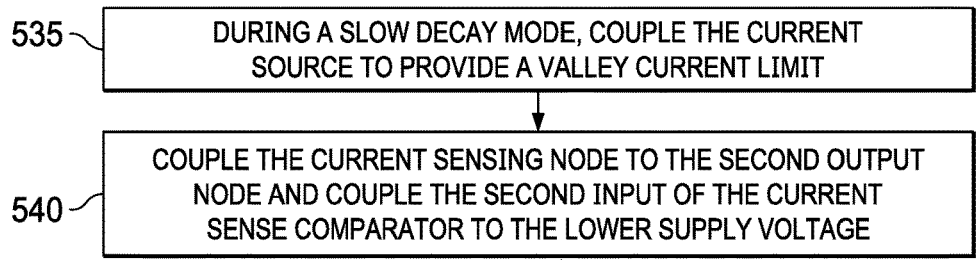

Method 500A can be utilized when an H-bridge and current sense circuit is configured as in H-bridge and current sense circuit 300A or as in H-bridge and current sense circuit 300B. FIGS. 5B and 5C add additional elements to method 500A, but are only utilized when current sensing during both drive mode and fast decay mode is performed using a single current sensing comparator. In this case, during a drive mode, the current source is coupled 525 to provide a peak current limit. The current sensing node is coupled 530 to the lower supply voltage and the second input of the current sense comparator is coupled to the second output node. During a slow decay mode, the current source is coupled 535 to provide a valley current limit; the current sensing node is coupled 540 to the second output node and the second input of the current sense comparator is coupled to the lower supply voltage.

The use of fast decay current sensing may provide better current regulation across all variations in motor supply voltage Vm and inductance L. Additionally, use of a single comparator to measure both peak current limit and valley current limit may provide increased accuracy of the ripple.

Figure 6:
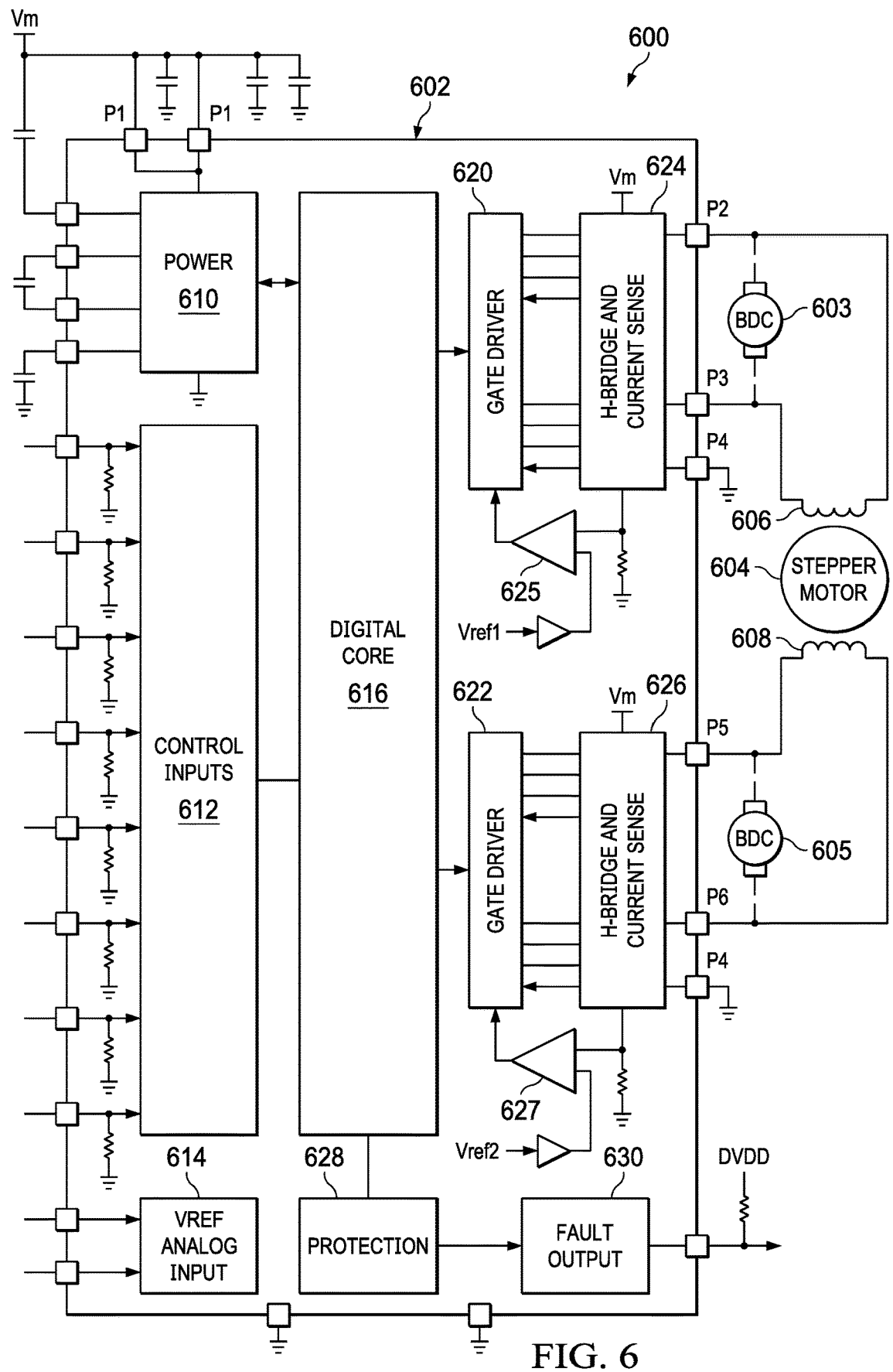
FIG. 6 is a schematic diagram illustrating a system that includes a current regulation apparatus according to an embodiment of the disclosure.

FIG. 6 depicts a system 600 that can include one or more of H-bridge and current sense circuits 100A, 300A, 300B1, 300B2. System 600 includes an IC chip 602 that is coupled to drive stepper motor 604 by controlling the inductor currents through a first inductor 606 and a second inductor 608. Alternatively, IC chip can be used to drive bidirectional currents through two external loads. In one alternate embodiment, the two external loads are a first brushed DC motor 603 and a second brushed DC motor 605.

A number of pins provide inputs and outputs to IC chip 602, although only a few of the pins are noted herein. Several first pins P1 are coupled to motor supply voltage Vm and several fourth pins P4 are coupled to the ground plane to provide the lower supply voltage. Second pin P2 is coupled to the high-side terminal of first inductor 606 and pin P3 is coupled to the low-side terminal of first inductor 606. Similarly, fifth pin P5 is coupled to the high-side terminal of second inductor 608 and sixth pin P6 is coupled to the low-side terminal of second inductor 608.

Within IC chip 602, a power supply circuit 610 receives motor voltage Vm and distributes power to the other circuits on IC chip 602. Power supply circuit 610 may include, for example, a charge pump and a regulator for the digital upper supply voltage DVDD. Control inputs circuit 612 receives logic control signals that are used to control the H-bridge circuits. These logic control signals may include, for example, enable signals and pulse width modulation (PWM) controls. Both power supply circuit 610 and control inputs circuit 612 are coupled to the digital core circuit 616. Digital core circuit 616 is coupled to send control signals to first gate driver circuit 620 and to second gate driver circuit 622.

First gate driver 620 is coupled to H-bridge and current sense circuit 624 to provide control signals for the H-bridge FETs and to receive current sense information. H-bridge and current sense circuit 624 is coupled to the high-side terminal of the first inductor 606 through second pin P2 and is coupled to the low-side terminal of the first inductor 606 through third pin P3. Current sensing elements in H-bridge and current sense circuit 624 are also coupled to current sense comparator 625 for comparison to a first reference voltage Vref1.

Similarly, second gate driver 622 is coupled to H-bridge and current sense circuit 626 to provide control signals for the associated H-bridge FETs and to receive current sense information. H-bridge and current sense circuit 626 is coupled to the high-side terminal of the second inductor 608 through fifth pin P5 and is coupled to the low-side terminal of the second inductor 608 through sixth pin P6. Current sensing elements in H-bridge and current sense circuit 626 are also coupled to current sense comparator 627 for comparison to a second reference voltage Vref2.

IC chip 602 also includes an analog voltage reference input circuit 614 that is coupled to receive voltage reference signals for each gate driver, a protection circuit 628 that monitors, e.g., for overcurrent, under voltage and over temperature conditions, and fault output circuit 630 that provides communication of any faults detected by protection circuit 628. IC chip 602 and more specifically H-bridge and current sense circuits 624, 626 can incorporate a FET linear detection circuit to provide adaptive blanking, such as FET linear detection circuit 100B. IC chip can also incorporate current sensing during fast decay mode, either alone or in combination with adaptive blanking. The comparator used for current sensing during fast decay mode can be dedicated to current sensing in fast decay mode, as shown in current sensing circuit 303 or can be shared between drive mode and fast decay mode, as shown in current sensing circuit 324.

Applicants have disclosed a method, circuit, system and IC chip that provide adaptive blanking that is agnostic of the slew-rate of the driver and independent of the algorithm used for current regulation. Applicants have also disclosed a method, circuit, system and IC chip that provide current sensing in fast decay mode, which enables a faster drop to a lower step without dropping lower than desired. Adaptive blanking and current sensing in fast decay mode can be utilized separately or in conjunction with each other to provide more robust current sensing. Motor operation may be smoother and less noisy with these tools.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An integrated circuit comprising:
    an H-bridge circuit including:
        a first high-side field effect transistor (FET) coupled in series with a first low-side FET between a motor supply voltage terminal and a lower supply voltage terminal, the first high-side FET and the first low-side FET having a respective gate and a respective first and second terminals, their first terminals coupled together; and
        a second high-side FET coupled in series with a second low-side FET between the motor supply voltage terminal and the lower supply voltage terminal, the second high-side FET and the second low-side FET having a respective gate and a respective first and second terminals, their first terminals coupled together;
    a current sense FET, in which a gate of the current sense FET is coupled to the gate of the first low-side FET;
    a current source coupled in series with the current sense FET between a digital upper supply voltage terminal and the first terminals of the first high-side FET and the first low-side FET; and
    a comparator having first and second inputs and a driver control output, the first input is coupled between the current source and the current sense FET, and the second input is coupled to the lower supply voltage.

2. The integrated circuit as recited in claim 1 in which the current source includes a digital-to-analog converter (DAC) and an operational amplifier, the operational amplifier being coupled between the DAC and the current sense FET.

3. An integrated circuit comprising:
    an H-bridge circuit including:
        a first high-side field effect transistor (FET) coupled in series with a first low-side FET between a motor supply voltage terminal and a lower supply voltage terminal, the first high-side FET and the first low-side FET having a respective gate and a respective first and second terminals, their first terminals coupled together; and
        a second high-side FET coupled in series with a second low-side FET between the motor supply voltage terminal and the lower supply voltage terminal, the second high-side FET and the second low-side FET having a respective gate and a respective first and second terminals, their first terminals coupled together;
a current sense FET;
a current source coupled between the current sense FET and an upper supply voltage terminal;
a comparator having first and second inputs and a driver control output, its first input coupled between the current source and the current sense FET;
a first switch coupled to the current sense FET, the lower voltage supply terminal, and the first terminals of the first high-side FET and the first low-side FET; and
a second switch coupled to the second input of the comparator, the lower voltage supply terminal, and the first terminals of the second high-side FET and the second low-side FET.

4. The integrated circuit as recited in claim 3 in which during a fast decay mode the current source is configured to provide a valley current limit, and during a drive mode the current source is configured to provide a peak current limit.

5. The integrated circuit as recited in claim 3 in which the current source is configured to provide a hysteretic reference current.

6. A system comprising:
a stepper motor including a first inductor having first and second inductor terminals;
a first H-bridge circuit including:
a first high-side field effect transistor (FET) coupled in series with a first low-side FET between a motor supply voltage terminal and a lower supply voltage terminal, the first high-side FET and the first low-side FET having a respective gate and a respective first and second terminals, their first terminals coupled to the first inductor terminal; and
a second high-side FET coupled in series with a second low-side FET between the motor supply voltage terminal and the lower supply voltage terminal, the second high-side FET and the second low-side FET having a respective gate and a respective first and second terminals, their first terminals coupled to the second inductor terminal;
a current sense FET, in which a gate of the current sense FET is coupled to the gate of the first low-side FET;
a current source coupled in series with the current sense FET between a digital upper supply voltage terminal and the first inductor terminal; and
a comparator having first and second inputs and a driver control output, its first input coupled between the current source and the current sense FET, and its second input coupled to the lower supply voltage terminal.

7. The system as recited in claim 6 in which the stepper motor includes a second inductor terminal having third and fourth inductor terminals, the system further comprising a second H-bridge circuit including:
a third high-side transistor and a third low-side transistor having respective first terminals coupled to the third terminal of the second inductor; and
a fourth high-side transistor and a fourth low-side transistor having respective first terminals coupled to the fourth terminal of the second inductor.

8. The system as recited in claim 6 in which the current source includes a digital-to-analog converter (DAC) and an operational amplifier, the operational amplifier being coupled between the DAC and the current sense FET.

9. The system as recited in claim 6 in which the current source is configured to provide a reference current that includes a valley current limit.

10. The system as recited in claim 9 in which the reference current is a hysteretic reference current that further includes a peak current limit.

11. A system comprising:
a stepper motor including a first inductor having a first and second inductor terminals;
an H-bridge circuit including:
a first high-side field effect transistor (FET) coupled in series with a first low-side FET between a motor supply voltage terminal and a lower supply voltage terminal, the first high-side FET and the first low-side FET having a respective gate and a respective first and second terminals, their first terminals coupled together; and
a second high-side FET coupled in series with a second low-side FET between the motor supply voltage terminal and the lower supply voltage terminal, the second high-side FET and the second low-side FET having a respective gate and a respective first and second terminals, their first terminals coupled to the second inductor terminal;
a current sense FET;
a current source coupled between the current sense FET and an upper supply voltage terminal;
a comparator including first and second inputs and a driver control output, its first input coupled between the current source and the current sense FET;
a first switch coupled to the current sense FET; and
a second switch coupled to the second input of the comparator, in which,
during a fast decay mode, the first switch is configured to couple the current sense FET to the first inductor terminal, and the second switch is configured to couple the second input of the comparator to the lower supply voltage terminal, and
during a drive mode, the first switch is configured to couple the current sense FET to the lower supply voltage terminal, and the second switch is configured to couple the second input of the comparator to the second inductor terminal.

12. A method comprising:
coupling a current sense field effect transistor (FET) to a first terminal of an inductor and to a first output node of an H-bridge circuit using a first switch, the first output node coupled between a first high-side FET that is coupled to a motor supply voltage terminal and a first low-side FET that is coupled to a lower supply voltage terminal, the current sense FET coupled in a series with a current source between an upper supply voltage terminal and the first switch;
coupling a second input of a comparator to the lower supply voltage terminal, a dirst input of the comparator coupled between the current source and the current sense FET; and
during a fast decay mode, providing a valley current limit as a reference current to the comparator using the current source.

13. The method as recited in claim 12 in which the reference current is a hysteretic reference current.

14. The method as recited in claim 13 including:
coupling the current sense FET to the lower supply voltage terminal using the first switch;
coupling the second input of the comparator to the second inductor terminal using the second switch; and during a drive mode, providing a peak current limit to the comparator using the current source.

\* \* \* \* \*